US010324236B2

(12) United States Patent
Moreau et al.

(10) Patent No.: US 10,324,236 B2
(45) Date of Patent: *Jun. 18, 2019

(54) OPTICAL DEVICE WITH A PIEZOELECTRICALLY ACTUATED DEFORMABLE MEMBRANE SHAPED AS A CONTINUOUS CROWN

(71) Applicant: Webster Capital LLC, Wilmington, DE (US)

(72) Inventors: Stephane Moreau, Le Chevalon de Voreppe (FR); Sébastien Bolis, Crolles (FR)

(73) Assignee: Webster Capital LLC, Wilmington, DE (US)

( * ) Notice: Subject to any disclaimer, the term of this patent is extended or adjusted under 35 U.S.C. 154(b) by 250 days.

This patent is subject to a terminal disclaimer.

(21) Appl. No.: 15/402,130

(22) Filed: Jan. 9, 2017

(65) Prior Publication Data

US 2017/0123113 A1    May 4, 2017

Related U.S. Application Data

(60) Continuation of application No. 14/098,981, filed on Dec. 6, 2013, now Pat. No. 9,541,677, which is a (Continued)

(30) Foreign Application Priority Data

Sep. 15, 2009   (FR) ..................................... 09 56328

(51) Int. Cl.
*H01L 41/09* (2006.01)
*G02B 3/12* (2006.01)
(Continued)

(52) U.S. Cl.
CPC ................ *G02B 3/12* (2013.01); *G02B 3/14* (2013.01); *G02B 26/004* (2013.01);
(Continued)

(58) Field of Classification Search
CPC .......... G02B 3/12; G02B 3/14; G02B 26/004; G02B 26/0825; G02B 27/0068
(Continued)

(56) References Cited

U.S. PATENT DOCUMENTS

| 8,013,494 B2 | 9/2011 | Morioke |
| 8,116,011 B2 | 2/2012 | Bolis |

(Continued)

FOREIGN PATENT DOCUMENTS

| FR | 2919073 | 1/2009 |
| JP | H08-114703 | 5/1996 |

(Continued)

OTHER PUBLICATIONS

Office Action from Japanese Application No. 2015-240969, dated Oct. 7, 2016, pp. 1-5.
(Continued)

*Primary Examiner* — Thomas M Dougherty
(74) *Attorney, Agent, or Firm* — Robert C. Kowert; Meyertons, Hood, Kivlin, Kowert & Goetzel, P.C.

(57) ABSTRACT

An optical device with a deformable membrane (2) including an anchor area (2.3) on a support (1) entrapping a liquid or gas fluid, a central area (2.1) reversibly deformable from a rest position, actuating means for moving the fluid (4) biasing the membrane (2) into an intermediate area between the anchor area (2.3) and the central area (2.1), the actuating means include a piezoelectric continuous crown accommodating several actuators (5.1), this crown surrounding the central area (2.1), the actuating means (5) being anchored to the membrane (2) in at least the intermediate area (2.2), the (Continued)

actuating means (5) and the membrane (2) to which they are anchored, forming at least one piezoelectric bimorph (B), the actuating means (5) radially contracting or extending upon actuation so as to generate a movement of said fluid (4) from the intermediate area (2.2) to the central area (2.1) of the membrane (2) or vice versa, aiming at deforming the central area (2.1) with respect to its rest position.

20 Claims, 16 Drawing Sheets

Related U.S. Application Data division of application No. 13/394,641, filed as application No. PCT/EP2010/063430 on Sep. 14, 2010, now Pat. No. 9,075,190.

(51) Int. Cl.
 *G02B 3/14* (2006.01)
 *G02B 26/08* (2006.01)
 *G02B 26/00* (2006.01)
 *G02B 27/00* (2006.01)

(52) U.S. Cl.
 CPC ..... *G02B 26/0825* (2013.01); *G02B 27/0068* (2013.01); *H01L 41/098* (2013.01)

(58) Field of Classification Search
 USPC .................................................. 310/324, 328
 See application file for complete search history.

(56) References Cited

U.S. PATENT DOCUMENTS

| 9,075,190 | B2* | 7/2015 | Moreau | G02B 3/14 |
| 9,541,677 | B2* | 1/2017 | Moreau | G02B 3/14 |
| 2001/0045792 | A1 | 11/2001 | Takeshima | |
| 2002/0048096 | A1 | 4/2002 | Melzer et al. | |
| 2004/0251781 | A1* | 12/2004 | Bouche | B81B 3/0078 310/324 |
| 2008/0239503 | A1 | 10/2008 | Conradi et al. | |
| 2010/0182703 | A1 | 7/2010 | Bolis | |
| 2010/0208357 | A1 | 8/2010 | Batchko et al. | |
| 2012/0170134 | A1 | 7/2012 | Bolis et al. | |

FOREIGN PATENT DOCUMENTS

| JP | 8-214567 | 8/1996 | |
| JP | H10-144975 | 5/1998 | |
| JP | 2000-081504 | 3/2000 | |
| JP | 5808328 | 2/2013 | |
| JP | 20120528386 | 2/2013 | |
| WO | WO-87/07218 A1 * | 12/1987 | ............... B41J 3/04 |
| WO | 2007/017089 | 2/2007 | |
| WO | 2008/035983 | 3/2008 | |
| WO | 2008/035984 | 3/2008 | |
| WO | 2008/044938 | 4/2008 | |
| WO | 2008/076399 | 6/2008 | |
| WO | 2008/100154 | 8/2008 | |
| WO | 2009/010559 | 1/2009 | |

OTHER PUBLICATIONS

International Search Report dated Dec. 15, 2010, in PCT/EP2010/063430.

French International Preliminary Report dated May 7, 2010, in French Patent Application No. FR 0956328 with English translation of category of cited documents.

Notice of Allowance from Japanese Application No. 2015240969, (Japanese Version Only) dated May 25, 2015, pp. 1-3.

Office Action from Japanese Application No. 2015-240969, dated Sep. 29, 2017 (Japanese version and English translation), pp. 1-9.

* cited by examiner

OPTICAL DEVICE WITH A PIEZOELECTRICALLY ACTUATED DEFORMABLE MEMBRANE SHAPED AS A CONTINUOUS CROWN

CROSS-REFERENCE TO RELATED APPLICATIONS

This application is a continuation of U.S. patent application Ser. No 14/098,981, filed Dec. 6, 2013, now U.S. Pat. No. 9,541,677, which is a divisional application of U.S. patent application Ser. No. 13/394,641, filed Mar. 7, 2012, now U.S. Pat. No. 9,075,190, which is a National Phase of PCT/EP2010/063430 filed Sep. 14, 2010, and claims priority to French Application No. 09 56328 filed Sep. 15, 2009. The entire contents of each of which are incorporated herein by reference.

TECHNICAL FIELD

The present invention relates to an optical device with a deformable membrane entrapping a fluid and provided with means for actuating the piezoelectric type membrane to adjust the radius of curvature of the membrane in its central part. Such an optical device with a deformable membrane can be a variable focus liquid lens, an optical aberration correcting liquid lens for active optics, or a variable focus mirror.

Liquid lenses are usable for example in portable phones with a camera function. Numerous developments are underway, among which in particular the autofocus function and the zoom function. It is attempted, upon introduction of these functions, to obtain as short a response time as possible but also to decrease the energy consumption upon actuation and to increase variations in the focus at a given energy consumption, while avoiding a complex manufacture of such apparatuses. More globally, it is attempted to integrate as many components as possible of such miniature cameras to reduce costs, bulk and energy consumption. These miniature cameras, operating in the visible range, are known as compact camera modules (CCM). The most successful liquid lens technology for this application is for the time being the one based on the electrowetting principle.

Another application concerns with cameras operating in infrared (IR). The progress in terms of integration is lesser, in most cases, and optics are dissociated from cameras. Several developments are underway among which in particular the integration of optics (creation of a camera module), integration of autofocus function, . . . For the time being, associated technical solutions are not known and need to be defined.

In an application for a deformable membrane mirror, the same is reflective. One could want to adjust the focal length of the mirror and thus its radius of curvature. Such a mirror can be used in ophthalmology or in active optics. Finally, these optical devices, whether of a lens type or mirror can be used to stabilize images.

STATE OF PRIOR ART

Patent application FR 2919073 describes an optical device including a supple membrane having a peripheral area for anchoring onto a support, the membrane and support entrapping a given volume of fluid and piezoelectric actuating means for moving the fluid at the central area of the membrane, in order to deform the central area of the membrane. The volume is substantially constant in a given temperature range. The actuating means are formed by a plurality of radial micro-beams, which are attached at one end to the support and the other end of which acts onto the membrane in an area located between the central area and the anchor area. One drawback in this configuration is that it is bulky since the actuating means lean on the support. Another drawback is that for a given bulk, and a given energy consumption, upon actuation, optical performances of the device are not optimum. Similarly, for a given bulk, and given optical performances, the energy consumption is high upon actuation.

Other patent applications describe optical devices with piezoelectric actuating means. Patent U.S. Pat. No. 4,802,746 can be mentioned wherein a cylinder element of piezoelectric materials, is closed at its two ends by walls of resilient material, the wall defining a cavity containing a strong resilient material.

In U.S. Pat. No. 4,407,567, a variable focus lens includes a cavity communicating with an expansion chamber, the cavity being bounded by a movable wall anchored to a support.

In the international patent application WO 2008/076399 is described a variable focus lens wherein actuating means of ion conducting polymer or, alternatively, piezoelectric materials are secured on the membrane without being directly integral thereto and transmit an actuating force substantially along the optical axis of the device. The actuating means are in the form of a continuous crown provided with a plurality of radial fingers, secured in the vicinity of the membrane.

Patent application US 2002/0048096 shows a deformable lens or mirror thanks to the action of piezoelectric elements as radially arranged bars. There is no fluid entrapped under the plate on which are anchored piezoelectric elements.

Patent application WO2008/100154 shows an optical device including a cavity containing a gel or elastomer type material closed by transparent covers. Piezoelectric type actuating means cooperate with one of the covers which is made of glass. The rigidity of this cover acts as a brake on the actuating efficiency and the material contained in the cavity, because it is of the gel or elastomer type, does not provide the expected feedback under the effect of actuation to deform the central area of the covers. It is the centre of the membrane which deforms the gel or elastomer under the effect of actuation and this membrane requires a high rigidity to achieve a given deformation. Such an optical device has a poor performance.

DESCRIPTION OF THE INVENTION

One object of the present invention is precisely to provide an optical device with a deformable membrane such as a lens or mirror which does not have the abovementioned drawbacks, that is bulk, high energy consumption and poor actuating efficiency.

Another object of the invention is to provide an optical device with a deformable membrane, of which the deformation of the membrane can be intentionally and very finely adjusted, whether the deformation is symmetrical or not, with respect to an optical axis of the optical device.

Another object of the invention is to provide an optical device with a deformable membrane wherein the optical aberrations are reduced.

Another object of the invention is to provide an optical device with a deformable membrane wherein the residual stresses occurring upon manufacturing are easier to manage during use.

Still another object of the invention is to provide an optical device with a deformable membrane, having an active compensation as a function of temperature, so as to maintain an unchanged focal length even if the room temperature varies.

To achieve this, the present invention provides an optical device with a deformable membrane including an anchor area on a support for entrapping an amount of liquid or gas fluid, a central area reversibly deformable from a rest position, actuating means for moving the fluid biasing the membrane into an intermediate area between the anchor area and the central area. The actuating means include a continuous crown of piezoelectric material accommodating several piezoelectric actuators each formed by a pair of electrodes sandwiching the continuous crown, this continuous crown being mounted around the central area without overlapping the same, the actuating means being anchored to the membrane at least in the intermediate area, the actuating means and the membrane to which they are anchored, forming at least one piezoelectric bimorph, the actuating means radially contracting or extending upon actuation so as to generate a movement of said fluid from the intermediate area to the central area of the membrane or vice versa, aiming at deforming the central area with respect to its rest position. This provides much flexibility to achieve a wanted deformation of the central area.

Since the actuating means include several piezoelectric actuators, they have several pairs of electrodes sandwiching the continuous crown, at least one electrode of a pair can be common to two or more piezoelectric actuators.

This enables the number of electrical outputs to be limited and the integration to be facilitated which results in a compact device.

The actuating means can also be anchored to the anchor area of the membrane and optionally directly on the support. Depending on whether the actuation means are anchored to the support or not, the deformation of the membrane is different. According to the desired form, it can be advantageous to anchor the actuating means to the support or not.

The actuating means can be overlying the membrane and/or underlying the membrane and/or integrated in the membrane. Again, a great number of possibilities is provided.

The membrane can include a stack of layers, at least at the intermediate area, among which a more rigid strengthening layer and a less rigid layer, the more rigid layer being part of the piezoelectric bimorph. Thus, the flexibility required in the central area and the rigidity required in the intermediate area can be achieved.

To avoid fluid leaks, it is preferable that the membrane includes a continuous layer which extends at the central area, intermediate area and anchor area.

Further auxiliary actuating means anchored to the membrane can also be provided, including a discontinuous crown of piezoelectric material accommodating one or more piezoelectric actuators, the discontinuous crown being concentrically mounted with the continuous crown, the auxiliary actuating means and the membrane to which they are anchored forming at least one piezoelectric bimorph. Thus, it is easy to achieve a wanted deformation of the membrane in the central area.

It is also possible to provide means for compensating a variation in the focal length of the optical device as a function of temperature. This enables the optical device to be operated without particular adjustment in a temperature range between about −20° C. and +60° C.

The compensating means can be confused with the piezoelectric actuator(s) of a continuous crown.

The compensating means can include one or more thermal bimorph elements arranged as a continuous crown, either anchored to the membrane at the anchor area by projecting into the intermediate area, or attached to the support opposite the membrane with respect to said fluid.

The piezoelectric actuators are separately actuatable from each other or they are simultaneously actuatable all together or even they are simultaneously actuatable by groups. This provides great flexibility to achieve a wanted deformation of the membrane in the central area.

It can be further provided one or more piezoelectric actuators arranged on a piezoelectric crown, anchored to the membrane in the intermediate area and optionally in the anchor area, passively operable through direct piezoelectric effect and dedicated to monitoring a deformation of the membrane.

The optical device can further include a protection cap attached to the support. The cap can be provided with an opening at the central area or is tight and entraps another fluid.

The membrane can be made of organic materials selected from polydimethylsiloxane, polymethylmethacrylate, polyterephthalate ethylene, polycarbonate, parylene, epoxy resins, photosensitive polymers, silicones, of mineral materials selected from silicon, silicon oxide, silicon nitride, silicon carbide, polycrystalline silicon, titanium nitride, diamond carbon, tin indium oxide, aluminium, copper, nickel, of piezoelectric materials.

Each of the fluids is a liquid selected from propylene carbonate, water, a refractive index liquid, an optical oil or even a ionic liquid, or a gas selected from air, nitrogen and helium.

The piezoelectric material can be made of on PZT, aluminium nitride, polyvinylidene floride or its copolymers with trifluoroethylene, zinc oxide, barium titanate, lead niobate, and sillenites such as bismuth titanate.

The optical device can be a lens or mirror.

The present invention also relates to a camera which includes at least one optical device thus characterised.

BRIEF DESCRIPTION OF THE DRAWINGS

The present invention will be better understood upon reading the description of exemplary embodiments given by way of purely indicative purposes and in no way limiting making reference to the appended drawings wherein.

Identical, similar or equivalent parts of the different figures described hereinafter have the same reference numbers so as to switch from one figure to another more easily.

Different parts represented in the figures are not necessarily drawn to a uniform scale, for making figures more intelligible.

DETAILED DESCRIPTION OF PARTICULAR EMBODIMENTS

Figure 1A:
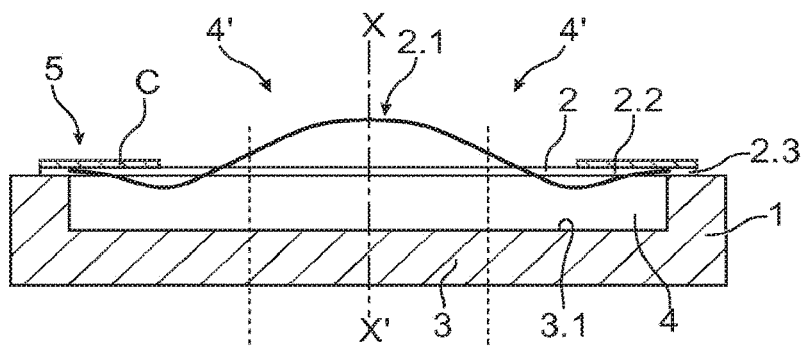
FIGS. 1A to 1C show a top cross-section view of an optical device useful to understand the invention, the membrane of the optical device of FIG. 1A being more supple than that of the optical device of FIG. 1C, FIG. 1D also showing a top view of another optical device useful to understand the invention with a single piezoelectric actuator.
Figure 1B:
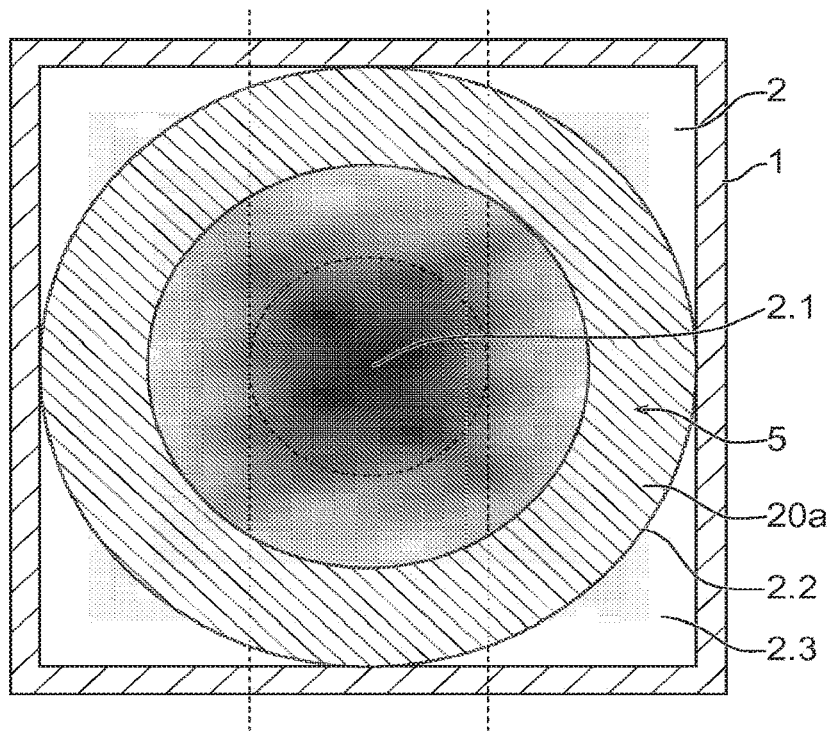
Figure 1C:
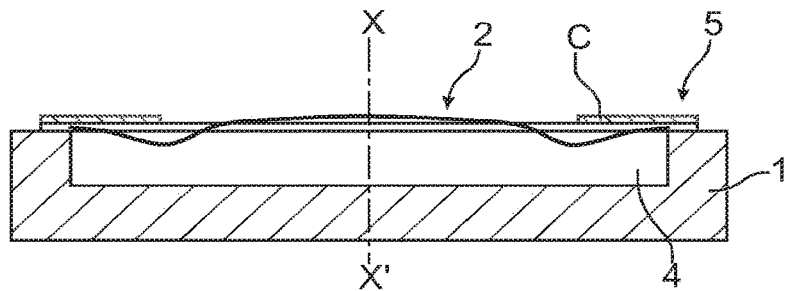

In FIGS. 1A, 1B is represented a first embodiment of an optical device useful to understand the invention. FIG. 1C shows a same embodiment of an optical device with a more rigid membrane. This optical device is constructed about an axis called optical axis XX'. It includes a membrane 2 the periphery of which is tightly anchored to a support 1 which, in this example, is a form of a dish. The membrane 2 therefore includes an anchor area referenced as 2.3 which is superimposed to the support 1. The membrane 2 also includes a central area 2.1 which corresponds to an optical field of the optical device. It is shown as a dotted line. The dish is intended to accommodate a liquid or gas fluid called first fluid 4. More generally, the membrane 2 and the support 1 aim at forming the cavity 3 wherein the fluid 4 is entrapped.

One of the faces of the membrane 2 is contacting the fluid 4 contained in the cavity 3. The other face of the membrane 2 is contacting a second fluid 4' which may be ambient air. One alternative will be seen later in which the second fluid 4' is entrapped, it can be air or another gas or even a liquid.

By membrane 2, it is intended any supple film acting as a barrier between the first fluid 4 and the second fluid 4' lying on the other side of the barrier with respect to the first fluid 4.

In the case where the optical device is a lens, the cavity 3 has a bottom 3.1 which is transparent to an optical beam (not shown) for being propagating through the lens. Moreover, the membrane 2 is transparent to the optical beam at least in the central area 2.1. If the optical device is a mirror, the membrane 2 is reflective at least in its central area 2.1. The optical beam can be a visible beam, but it can extend beyond the visible range, for example in infrared.

The membrane 2 is supple and reversibly deformable, from a rest position represented in FIG. 1A, under the action of a movement of the fluid 4 contained in the cavity 3 so as to vary the thickness of the fluid 4 located at the central area 2.1 of the membrane 2 and thus curve the central area 2.1 of the membrane 2. The fluid 4 contained in the cavity 3 is sufficiently incompressible to be moved to the central area 2.1 when a strain is applied onto the membrane 2, this strain being applied onto the membrane 2 in an intermediate area 2.2 located between the central area 2.1 and the anchor area 2.3. It has a substantially constant volume in a given temperature range. The fluid contained in the cavity serves as a "transmission" between the actuation means 5 and the central area 2.1 of the membrane 2. This fluid 4 can be a liquid or a gas. The feedback of the fluid is used upon actuation to obtain the deformation of the membrane in the central area 2.1.

It will be noted that in FIGS. 1A, 1B, the outline of the membrane 2 and the support 1 have been represented in squares whereas the central area 2.1 has been represented circular. Of course, these shapes are not limiting. The membrane 2 and the support 1 may be circular, rectangular, ovoid or other and the central area 2.1 could be square, rectangular, ovoid or other.

Piezoelectric actuating means 5 are provided to move the fluid 4 from the cavity 3. They bias the membrane 2 into the intermediate area 2.2. These actuating means 5 are configured into at least one circular, continuous crown C of piezoelectric material concentrically mounted about the central area 2.1. This continuous crown C of piezoelectric material accommodates a piezoelectric actuator (not clearly visible in FIGS. 1A to 1C). Each continuous crown C extends in a main plane which is the plane of the membrane 2 when the same is planar as in FIG. 1A in the rest position. In other configurations, the central area 2.1 of the membrane 2 may be bulging at rest and the intermediate area 2.2 in turn would be substantially planar.

Figure 2A:
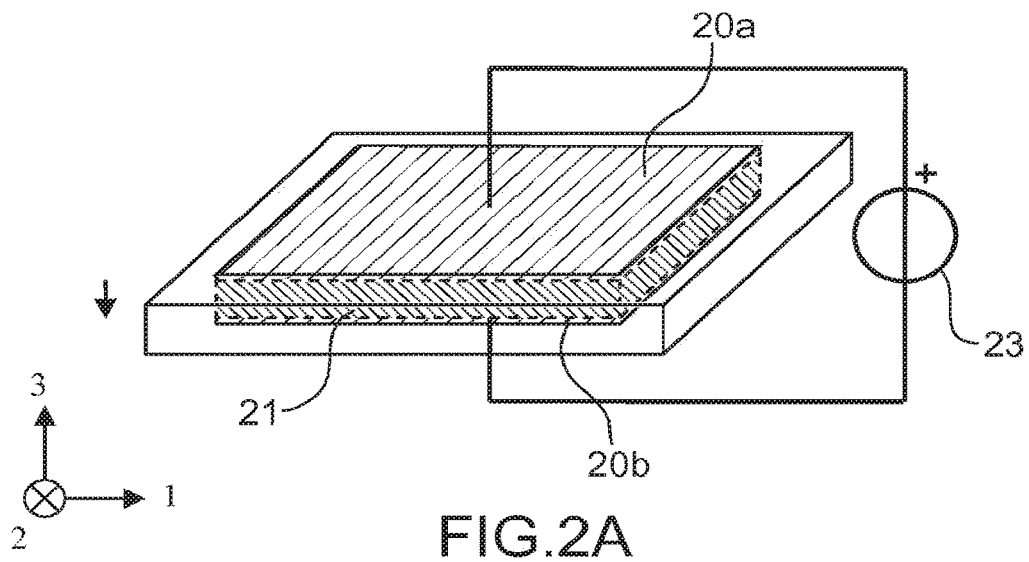
FIGS. 2A, 2B enable the understanding of the operation of a piezoelectric element provided with a pair of electrodes.
Figure 2B:
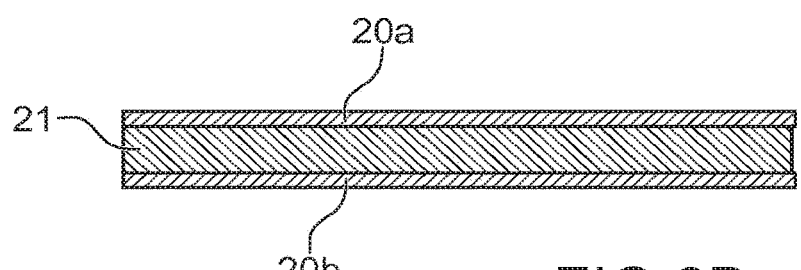

It is reminded, referring to FIGS. 2A, 2B, that a piezoelectric actuation includes a block 21 of piezoelectric material totally or partially sandwiched between two electrodes 20a, 20b for, when powered, applying an internal electric field to the piezoelectric material. The arrow represents the internal bias of the piezoelectric material possibly made during the manufacturing process. A power source is referenced 23. This electrical field is used to control a mechanical deformation of the block 21 of piezoelectric material. The block 21 of the piezoelectric material may be single-layered or multilayered and extend beyond an electrode. The electrodes 20a, 20b located on both side of the block 21 of piezoelectric material are visible in FIGS. 2A, 2B. The inverse piezoelectric effect has thus been described.

Figure 5A:
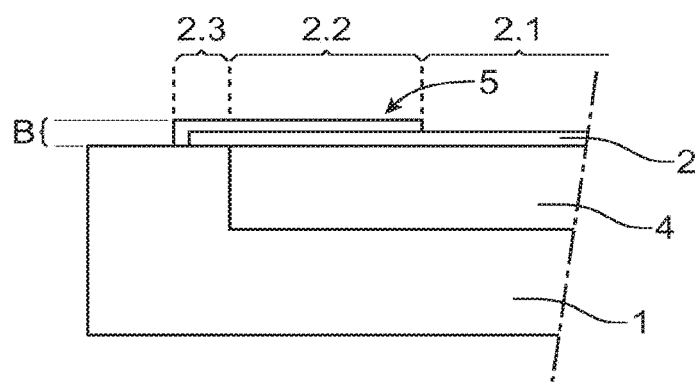
FIGS. 5A to 5M show in cross-section different arrangements between the membrane and the actuating means.
Figure 5B:
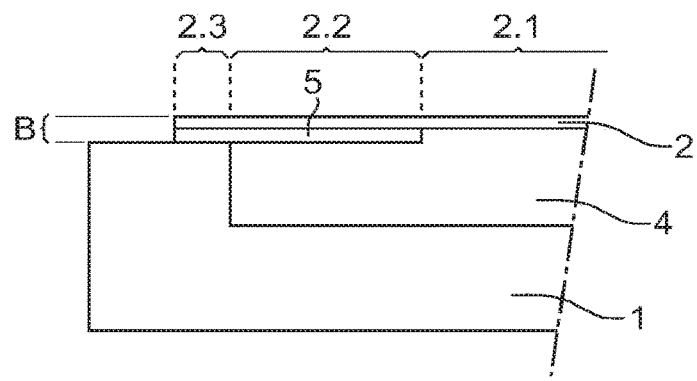
Figure 5C:
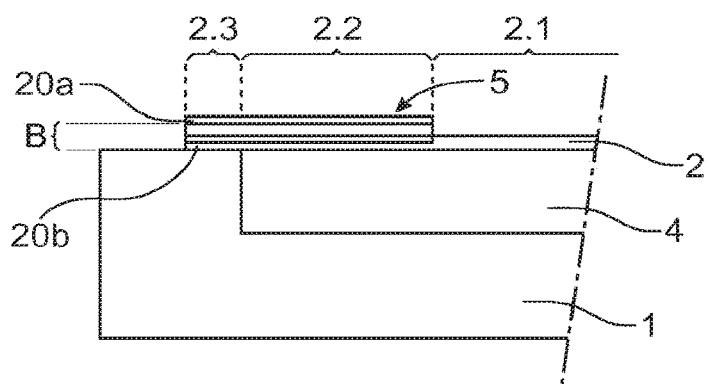

The electrodes on the continuous crown C of piezoelectric material have only been represented in some figures, in particular FIG. 5C, and the reason why is that their thickness can be negligible with respect to that of the piezoelectric material and also of the membrane 2. As represented, the electrodes 20a, 20b are located on both opposite main faces of the continuous crown C of piezoelectric material, these main faces being substantially normal to the optical axis of the optical device.

In FIG. 2A, the aspect of the block 21 of piezoelectric material is represented before and after applying a bias voltage onto the electrodes 20a, 20b. After applying the bias voltage, the block 21 has extended in the plane of the electrodes and has contracted transversally to this plane or inversely depending on the bias sign.

In the present invention, the piezoelectric actuating means 5 are directly anchored into the membrane 2 in the intermediate area 2.2, but they can also be anchored to the membrane 2 in the anchor area 2.3. Of course, this is not obligatory. However, they have no anchoring to the membrane 2 in the central area 2.1.

The piezoelectric actuating means 5 and the membrane 2 when integral form at least a piezoelectric bimorph B, this piezoelectric bimorph being either heterogeneous or homogeneous. More precisely, each piezoelectric actuator and the membrane with which it is integral form a piezoelectric bimorph. It is reminded that a piezoelectric bimorph includes a layer of piezoelectric material, equipped with electrodes, adjoining a layer of piezoelectric material, when the bimorph is homogeneous or non-piezoelectric material when the bimorph is heterogeneous. In this case, this layer of piezoelectric material or non piezoelectric is a layer of the membrane 2.

Upon applying a bias voltage to the electrodes 20a, 20b of the piezoelectric actuator 5.1, the continuous crown C of piezoelectric material which accommodates it radially contracts or extends depending on the bias which is applied to the electrodes 20a, 20b, this deformation resulting in moving the fluid and therefore changing the curvature of the membrane 2 in the central area 2.1. Mainly the difference between the external radius and the internal radius of the continuous crown C varies at the electrodes 20a, 20b when they are subjected to a bias voltage. It will be seen subsequently that the direct effect can also be exploited in the optical device object of the invention.

The positioning of the electrodes 20a, 20b required to obtain the wanted deformation corresponds to a transverse coupling of the piezoelectric material. But of course, another coupling mode can be retained, for example longitudinal or shearing.

In FIG. 1A, a thin continuous line represents the profile of the membrane 2 when it has been deformed by the actuating means 5. The deformation results in a greater thickness of the fluid 4 being located at the central area 2.1 and in a smaller thickness of the fluid 4 being located at the intermediate area 2.2. These observations have been made in comparison with the substantially planar profile of the membrane 2 at the rest position. In this FIG. 1A, the membrane 2 has a convex curvature at the central area 2.1 and concave at the intermediate area 2.2 when it has been deformed. In FIG. 1C, a thin continuous line represents the profile of a membrane 2 having a lesser suppleness than that illustrated in FIG. 1A. It has been deformed by the same actuating means 5 subjected to a same actuating voltage. Its deformation has a maximum amplitude much less significant than in the previous case either in the central area 2.1 or in the intermediate area 2.2.

In FIGS. 1A to 1C, it is indicated that the actuating means 5 only include a single piezoelectric actuator. This means that only a single pair of piezoelectric electrodes 20a, 20b supported by the continuous crown C has been provided. The electrodes of the pair are located on both sides of the continuous crown C of piezoelectric material, one 20a being overlying the continuous crown C and the other being underlying and not visible.

Figure 1D:
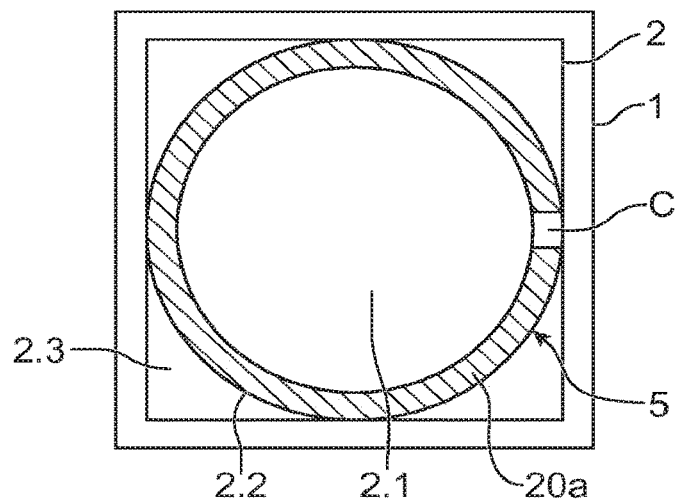

Both electrodes 20a, 20b of the pair have the form of a circular continuous crown substantially similar to that of piezoelectric material. In fact, in FIG. 1B, only the overlying electrode 20a can be seen, the continuous crown of piezoelectric material and the overlying electrode being masked. It would have been possible for at least one of the electrodes to be in a crown portion shape, in other words in a slit crown shape as in FIG. 1D. It is the electrode 20a. Thus, one of the electrodes of the single piezoelectric actuator does not necessarily cover the entire face of the piezoelectric material on which it is located. Such a configuration makes a dissymmetrical actuation easier. The configuration of FIG. 1B of course provides a greater efficiency.

An optical device according to the invention will now be described referring to FIGS. 3A to 3E. The optical device object of the invention is comparable to that represented in FIG. 1, except that the actuating means include at least one continuous crown of piezoelectric material gathering several piezoelectric actuators, each actuator including a pair of electrodes sandwiching the continuous crown.

Figure 3A:
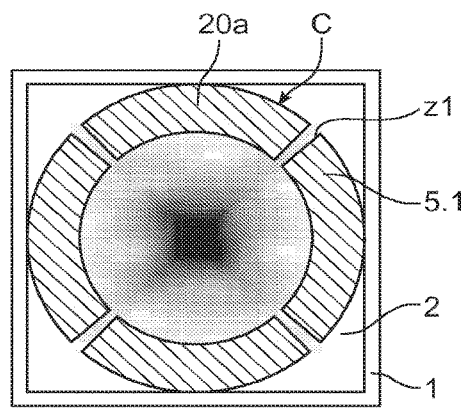
FIGS. 3A to 3G are top views of different alternatives of the optical device according to the invention.
Figure 3B:
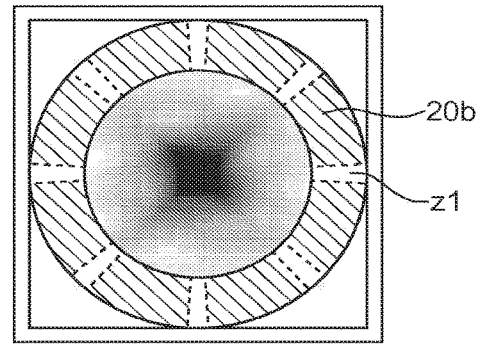

In configurations of FIGS. 3A, 3B, there is only a single continuous crown C of piezoelectric material. In FIG. 3A, there are four piezoelectric actuators 5.1. Four electrodes 20a in crown sectors overlying to the continuous crown C are distinguished. In this example, the four electrodes 20a are substantially identical and are substantially regularly provided on the continuous crown C of piezoelectric material. In a general case, there would also be four electrodes in crown sectors underlying the continuous crown C facing the four overlying electrodes. This is why the underlying electrodes corresponding to this case have not been represented.

In FIG. 3B, eight electrodes 20b are represented in overlying crown sectors. In these both FIGS. 3A, 3B, radial areas z1 between two continuous crown sectors let the piezoelectric material of the piezoelectric bimorph appear. Both figures can show both opposite faces of the actuating means of a same optical device object of the invention. Eight piezoelectric actuators are therefore provided.

Figure 3C:
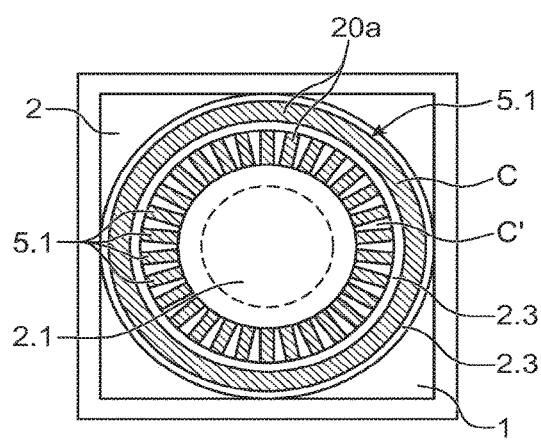

In FIG. 3C, piezoelectric actuating means are represented including two continuous crowns C, C' of piezoelectric material at least one of which accommodates several piezoelectric actuators 5.1. The two continuous crowns C, C' are concentric, the continuous crown C' being internal and the continuous crown C being external. It is assumed that the continuous crown C overlaps the anchor area 2.3 of the membrane 2 but not the continuous crown C'. The membrane 2 is circular. A plurality of piezoelectric actuators 5.1 has been represented on the internal continuous crown C' and a single one on the external continuous crown C. In FIG. 3C, the overlying electrodes 20a of the piezoelectric actuators 5.1 located on the internal continuous crown C' are radial elongated pads. The underlying electrodes cannot be seen.

Figure 3D:
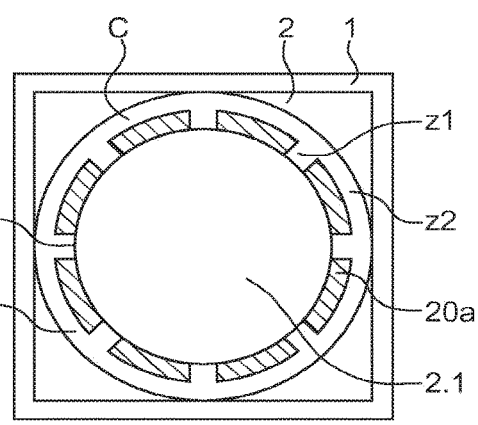

In the case of FIGS. 1A, 3A, 3B, the electrodes in crown sectors have internal and external radiuses which are substantially the same as those of the continuous crown C of piezoelectric material which supports them. It is possible for the electrode 20a or 20b in crown sectors to have at least an internal or external radius which is different from the internal or external radius of the continuous crown C of piezoelectric material. FIG. 3D is referred to.

This means that at least one longitudinal area z2 lets the piezoelectric material of the continuous crown C appear.

It will be understood that there is a great number of alternatives to place the electrodes onto a face of the continuous crown of piezoelectric material.

Both electrodes 20a, 20b of a pair in a piezoelectric actuator needn't to be identical. In particular, several piezoelectric actuators can share a same electrode as already illustrated in FIGS. 3A, 3B. This common electrode can be used by all the piezoelectric actuators or by some of them for example.

It may be considered for example that two neighbour piezoelectric actuators share a same electrode. That is what FIGS. 3A and 3B want to illustrate. Two piezoelectric actuators share a same electrode 20a, however they have their own electrode 20b.

Each pair of electrodes 20a, 20b can be independently powered from the others, which means that all the pairs of electrodes can be subjected to different voltages. Thus, the deformation of the membrane 2 in the central area 2.1 can be anti-symmetrical, non-axisymmetrical and very numerous possibilities of deformation exist. But the fact the crown C of piezoelectric material is continuous results in its area anchored in the membrane being significant, which ensures an increased efficiency in actuation, without disadvantages in terms of stiffness in flexure as illustrated in FIG. 10C.

Using discontinuous electrodes 20a, 20b on at least one of the faces of the continuous crown C of piezoelectric material in a lens used in a camera type apparatus enables the "movement correction" thematic to be simply addressed by providing a lens dioptre deformation either axisymmetric, anti-axisymmetric or other.

Figure 3E:
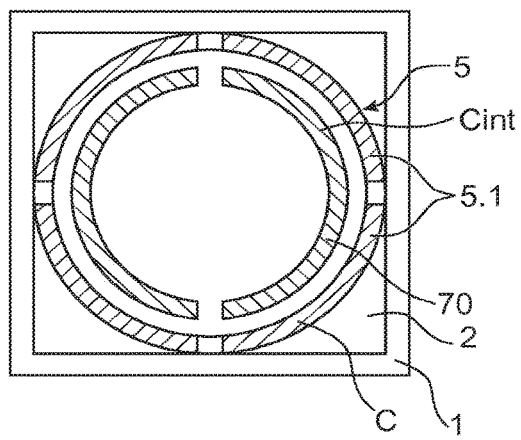

It is possible to use the direct piezoelectric effect to monitor the deformation of the membrane 2 when there are several piezoelectric actuators 5.1. The voltage which appears across a non-actuated one of the piezoelectric actuators can be acquired whereas other piezoelectric actuators for the same continuous crown are actuated. It is also possible to provide one or more piezoelectric actuators able to operate passively through direct piezoelectric effect, arranged as a crown specially dedicated to this monitoring as illustrated in FIG. 3E. The internal crown Cint of piezoelectric material accommodates at least one passive piezoelectric actuator 70 detecting the local deformation of the membrane 2 through direct effect. The internal crown Cint can be continuous or in lumps, each of the lumps accommodating one or more piezoelectric actuators being operable through direct effect. The internal crown Cint is anchored to the membrane 2 in the intermediate area 2.2, it does not overlap the central area 2.1, nor the anchor area 2.3. This is only one example, since the actuators dedicated to monitoring could be anchored to the anchor area of the membrane. In the example of FIG. 3E, the internal crown Cint is in two lumps, each accommodating a passive piezoelectric actuator 70. It is of course possible that a same piezoelectric actuator is intended to deform the membrane intermittently and is intended to monitor the deformation of the membrane intermittently. It can therefore be passive at some times and active at other ones.

Still another alternative would be to use in lieu of a piezoelectric actuator a stress gauge of another type to monitor the deformation of the membrane.

The actuating means 5 are formed by several unit piezoelectric actuators 5.1 arranged on the continuous crown C of piezoelectric material. The continuous crown C is located about the internal crown Cint. The piezoelectric actuators 5.1 are actuatable through inverse effect.

Figure 3F:
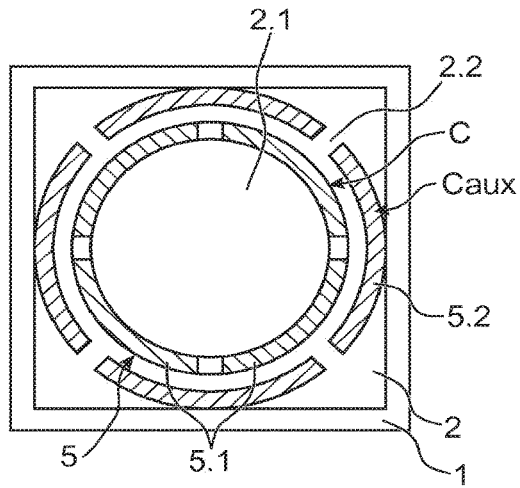

It is also possible that the optical device includes auxiliary actuating means 5' with at least one auxiliary discontinuous crown Caux of piezoelectric material accommodating several auxiliary piezoelectric actuators 5.2 operating through inverse effect. The auxiliary crown Caux is concentrically mounted with the continuous crown C. It can be located outside as in FIG. 3F or inside. In an effort not to add unnecessarily figures, the alternative with the internal auxiliary crown has not been represented. But FIG. 3E can be referred to realise the aspect such a configuration would have if the actuators 70 were operating through inverse effect. This auxiliary crown Caux is anchored to the membrane 2 into the intermediate area 2.2, it can overlap the anchor area 2.3 but not the central area 2.1. The auxiliary actuating means 5' also form with the membrane 2 at least one piezoelectric bimorph.

Figure 3G:
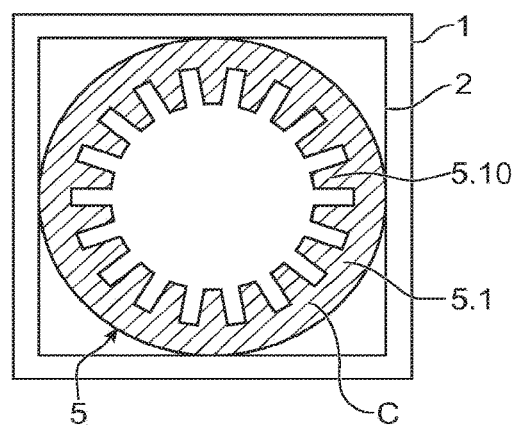

It can be contemplated referring to FIG. 3G that the actuating means 5 comprise a continuous crown C accommodating several piezoelectric actuators and that this continuous crown C is provided on one of its peripheries with radially oriented bars, these bars accommodating unit piezoelectric actuators 5.10. The bars can thus be oriented inwards the crown C or outwards.

Figure 4A:
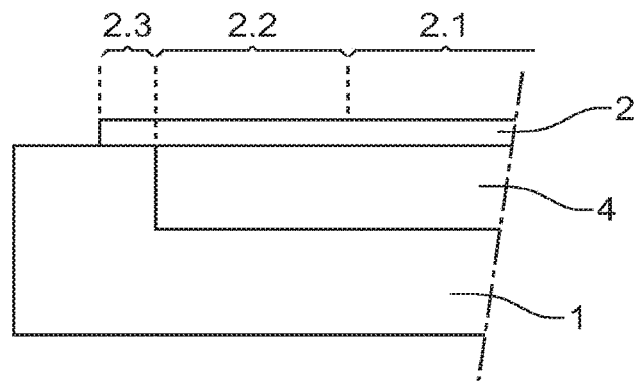
FIGS. 4A to 4C show in cross-section the anchoring of the membrane, for different types of membrane.
Figure 4B:
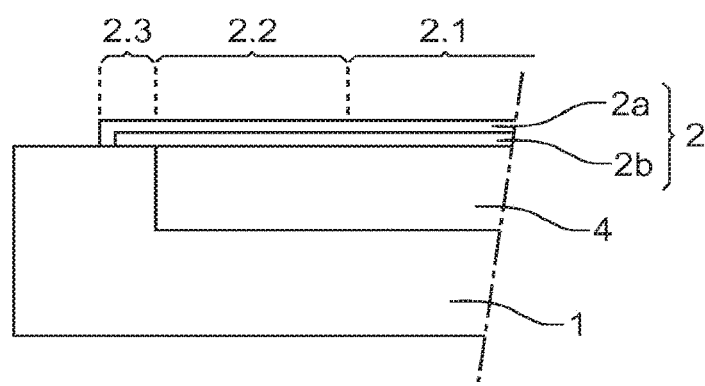
Figure 4C:
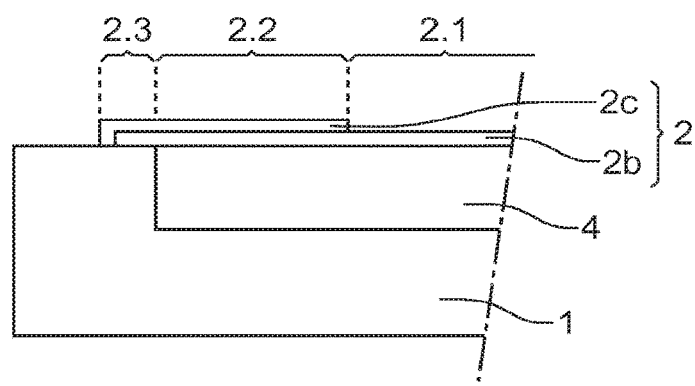

Referring to FIGS. 4A to 4C, some characteristics of the membrane 2 will now be given. This membrane 2 includes at least three areas as already set out, called anchor area 2.3, intermediate area 2.2 and central area 2.1 when going from its edge to its centre. The intermediate area 2.2 is the one which is directly biased by the actuating means 5 and possibly by the auxiliary actuating means. The central area 2.1 dedicated to the optical field is deformed by movements of the fluid 4. Since this deformation is reversible, the material of this central area 2.1 will work in the elastic deformation field. Its transparency or on the opposite its reflective properties are selected depending on whether the optical device is a lens or a mirror. That the membrane 2 may be single layered and homogeneous from the central area 2.1 to the anchor area 2.3 (FIG. 4A). It can alternatively be multilayer as in FIG. 4B, both layers being referenced 2a, 2b. It has two superimposed layers 2a, 2b in the central area 2.1, in the intermediate area 2.2 and in a part of the anchor area 2.3. In this anchor area 2.3, the overlying layer 2a of the stack is directly extended onto the support 1 beyond the underlying layer 2b.

The anchor area 2.3 of the membrane 2 should have in turn adhesion properties onto the support 1. The overlying layer 2a of FIG. 4B can be selected to have better adhesion properties onto the support 1 than the underlying layer 2b.

The intermediate area 2.2 of the membrane 2 can have properties enabling the deformation induced by the actuating means 5 to be enhanced, which means that it will be preferably selected with a rigidity higher than that of the central area 2.1. There is an interaction between the membrane 2 and the actuating means 5 in the intermediate area 2.2 since it is in this area that the piezoelectric bimorph is located.

The deflection direction of the membrane 2 in the central area 2.1 depends on the difference in mechanical properties between the piezoelectric material and the material(s) of the membrane 2 on which the continuous crown of piezoelectric material is anchored. The bias direction and the position of the continuous crown of piezoelectric material are also important.

The membrane 2 can therefore be heterogeneous with at least one so-called main layer 2b which lies in the central area 2.1 and which continuously extends on the entire surface of the membrane 2 and at least one strengthening layer 2c which only extends on part of the membrane 2, of which at least the intermediate area 2.2. In FIG. 4C which illustrates this case, the main layer 2b extends on the entire surface of the membrane 2 and the strengthening layer 2c extends, in this example, on the anchor area 2.3 and the intermediate area 2.2. The strengthening layer 2c directly overlaps the support 1 in the same manner as in FIG. 4B. In FIGS. 4A to 4C, the actuating means 5 have been omitted.

The arrangement between the membrane 2 and the actuating means 5 will now be reviewed given that the actuating means 5 are anchored to the anchor area 2.3 in addition of being anchored to the intermediate area 2.2. FIGS. 5A to 5C are referred to. In these figures, the membrane 2 is represented as single layered, but this is not limiting. This is this layer of the membrane 2 which promotes the formation of the piezoelectric bimorph B. In FIG. 5A, the actuating means 5 are overlying the membrane 2, they extend on the intermediate area 2.2 and the anchor area 2.3 and are directly extended onto the support 1. They are contactless with the fluid 4 entrapped between the membrane 2 and the support 1. In FIG. 5B, they are underlying to the membrane 2 and in the same manner, extend onto the intermediate area 2.2 and the anchor area 2.3 but do not overlap the support 1. It is of course possible that they overlap the support 1. They are contacting the fluid 4 entrapped between the support 1 and the membrane 2. In both figures, the anchoring between the actuating means 5 and the support 1 is direct.

In FIG. 5C, the actuating means are overlying the membrane 2, they extend onto the intermediate area 2.2 and onto the anchor area 2.3, possibly partially, but no dot directly overlap the support 1. They are not contacting the fluid 4 entrapped between the membrane 2 and the support 1. In the latter case, the anchoring between the actuating means 5 and the support 1 is indirect. In this figure, the electrodes 20a, 20b of the actuating means have been represented.

Figure 5D:
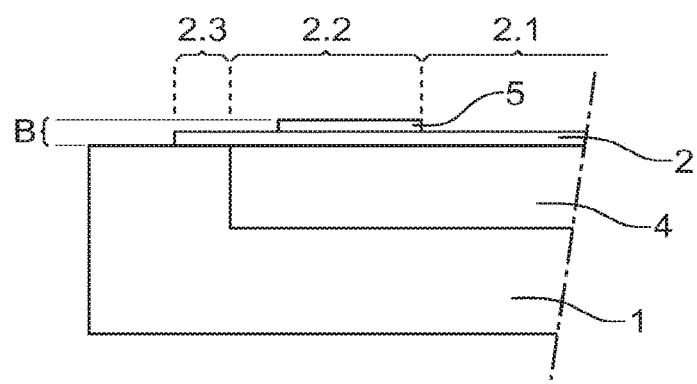
Figure 5E:
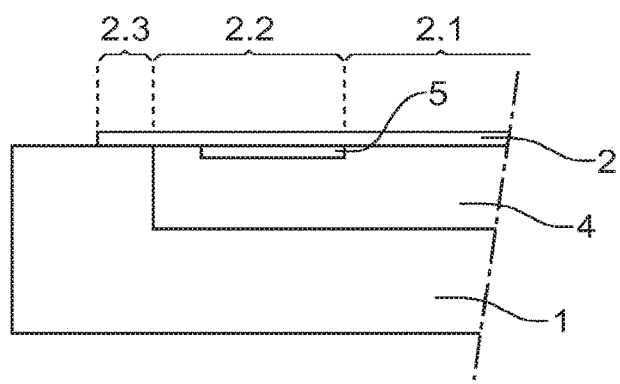

FIGS. 5D, 5E will now be referred to, which show two cases where the actuating means 5 are not anchored to the support 1. They therefore do not overlap the anchor area 2.3 of the membrane 2. Once again, the membrane 2 is single-layered, but could be multilayer. In FIG. 5D, the actuating means 5 are overlying the membrane 2. They are contactless with the fluid 4 entrapped between the membrane 2 and the support 1. In FIG. 5E, the actuating means 5 are overlying to the membrane 2, they are contacting the fluid 4 entrapped between the membrane 2 and the support 1.

Figure 5F:
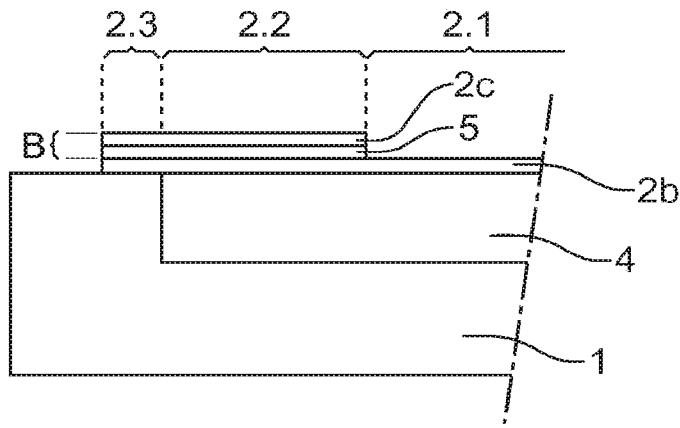
Figure 5G:
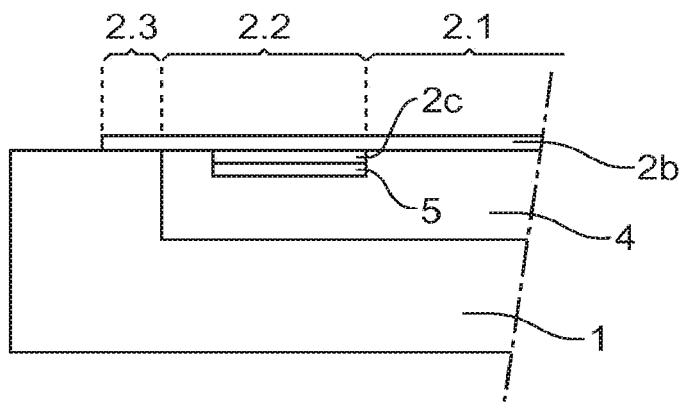
Figure 5H:
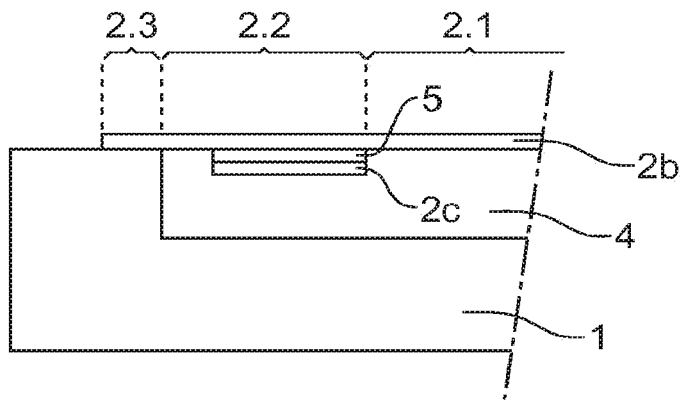
Figure 5I:
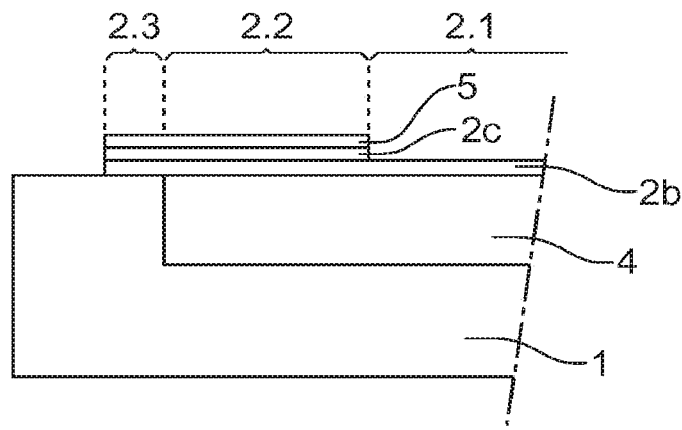

It will now be shown in FIGS. 5F and 5I examples on which the membrane includes a main layer 2b which continuously extends from the central area 2.1 to the anchor area 2.3 and, at the intermediate area 2.2, a strengthening layer 2c which can be overlying the main layer 2b as in FIGS. 5F, 5I or underlying as in FIGS. 5G, 5H. In FIG. 5F, the actuating means 5 are inserted between the main layer 2b and the strengthening layer 2c. The actuating means 5 and the strengthening layer 2c are contactless with the fluid 4 entrapped between the membrane 2 and the support 1. The strengthening layer 2c is more rigid than the main layer 2b, it will promote the formation of the piezoelectric bimorph B. The main layer 2b becomes passive as regards to the mechanical phenomena involved. The main layer 2b is configured to be as supple as possible so as to avoid an energy overconsumption upon actuation to achieve a given deformation. Are represented in FIGS. 1A an 1C different deformations for a same energy consumption and different supplenesses of the membrane 2.

In FIG. 5G, the strengthening layer 2c is inserted between the actuating means 5 and the main layer 2b. The actuation means 5 and the strengthening layer 2c are contacting the fluid 4 entrapped between the membrane 2 and the support 1.

In FIG. 5H, the actuating means 5 are inserted between the strengthening layer 2c and the main layer 2b of the membrane 2. The actuating means 5 and the strengthening layer 2c are contacting the fluid 4 entrapped between the membrane 2 and the support 1.

In FIG. 5I, the strengthening layer 2c is inserted between the actuating means 5 and the main layer 2b. The actuation means 5 and the strengthening layer 2c are contactless with the fluid 4 entrapped between the membrane 2 and the support 1.

In FIGS. 5F and 5I, the actuating means 5 are indirectly anchored to the support 1.

Figure 5J:
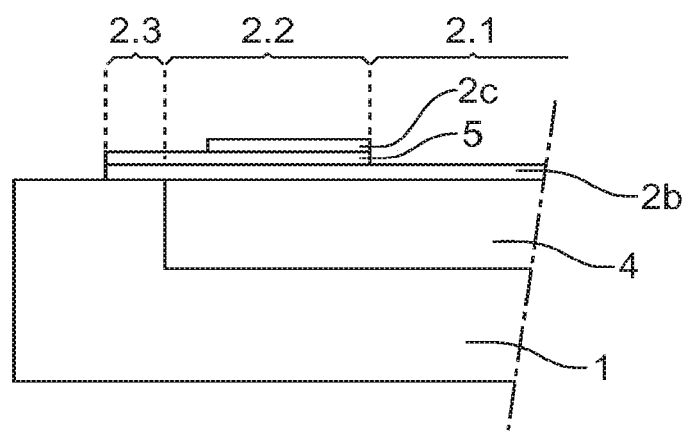

In FIG. 5J, the actuating means 5 are overlying the main layer 2b of the membrane 2, they are anchored to the support 1, they extend on the anchor area 2.3 of the membrane 2. The strengthening layer 2c in turn is overlying the actuating means 5, it only extends on the intermediate area 2.2 and does not overlap the anchor area 2.3.

Figure 5K:
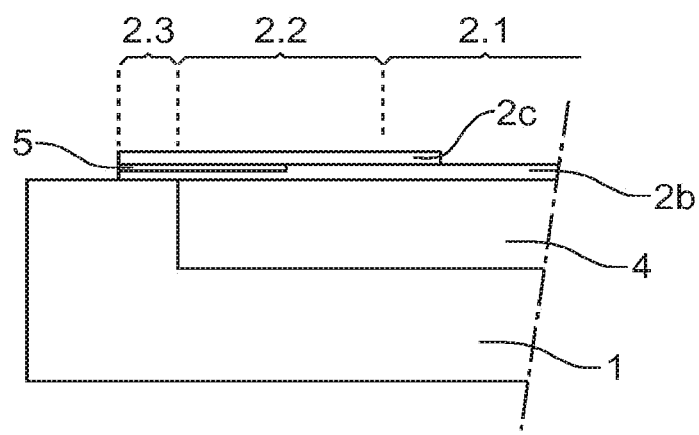

In FIG. 5K, the main layer 2b of the membrane 2 is thicker in the central area 2.1 than in the intermediate area 2.2 and in the anchor area 2.3. The actuating means 5 are overlying the main layer 2b, they extend only in one part of the intermediate area 2.2, a part farthest from the central area 2.1, and in the anchor area 2.3. The thickness of the actuating means 5 and the main layer 2b in the intermediate area 2.2 and in the anchor area 2.3 is substantially equal to that of the main layer 2b in the central area 2.1. The strengthening layer 2c is overlying the actuating means 5, it extends in the entire intermediate area 2.2, and it extends beyond the actuating means 5.

It is however possible that the strengthening layer 2c extends in the central area 2.1 as in FIG. 5K if its reflection or transmission optical properties are compatible with the application of the optical device, that is with the lens or mirror. In this case, of course, the deformation of the membrane at the strengthening layer 2c must be compatible with the attempted deformation for the membrane.

Figure 5L:
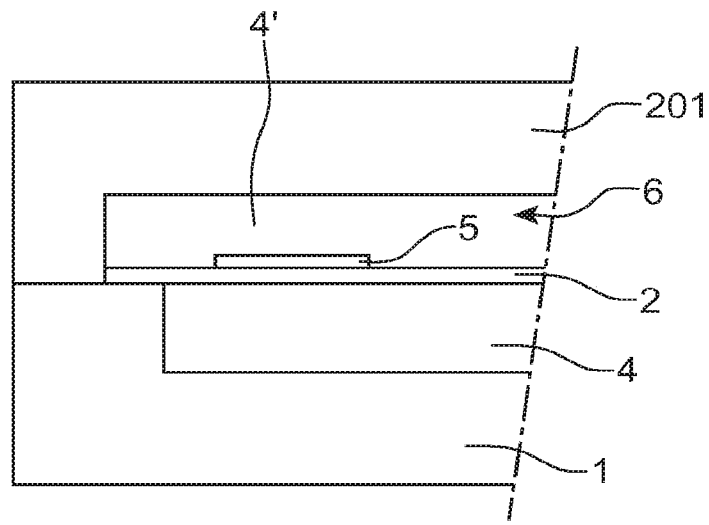
Figure 5M:
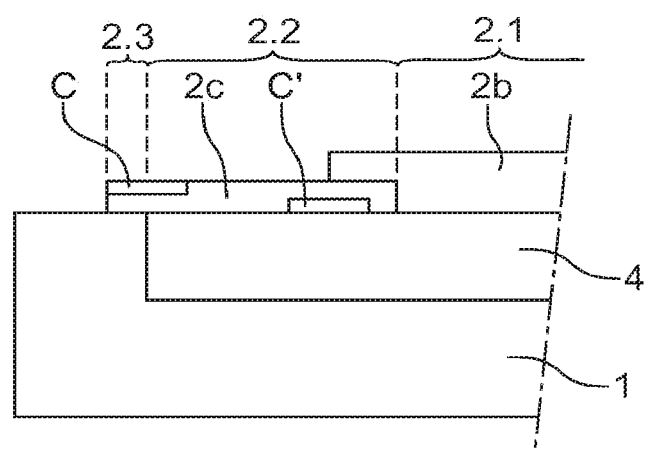

In FIG. 5M, there is a strengthening layer 2c and the main layer 2b present at the central area 2.1 is not continuous up to the anchor area 2.3 as above. It extends at the intermediate area 2.2 but stops before the anchor area 2.3. The strengthening layer 2c then takes it over. Once again, this layer 2b which extends at the central area 2.1 is thicker at the central area 2.1 than at the intermediate area 2.2. The assembly between the strengthening layer 2c and the main layer 2b which lies in the central area 2.1 must be sufficiently tight so that the fluid 4 whose trapping is promoted by the support 1 and the membrane does not leak from the cavity, even when the actuating means 5 are actuated. In this figure, the actuating can be compared to those illustrated in FIG. 3C, one of the crowns referenced C is overlying the membrane 2 and the other one referenced C' is underlying.

FIG. 5L is still another example of the optical device according to the invention wherein the actuating means 5 are contacting the fluid 4 entrapped between the support 1 and the membrane 2, and they are overlying the membrane 2 which is single-layered.

It is possible that the membrane 2, provided with the actuating means 5, is capped with a protecting cap 201 which is sealed to the support 1 as illustrated in FIG. 5L. This cap 201 bounds a cavity 6. The attachment can be made for example by molecular bonding, by organic bonding, by anodic bonding, by eutectic bonding of an alloy layer for example of Au/Si or Au/Sn for example being sandwiched between the cap 201 and the support 1 to be sealed. These bonding techniques are commonly used in the microelectronics and microsystem fields.

The cap 201 bounds a cavity 6 wherein is entrapped a second fluid 4', the top face of the membrane 2, that is the one which does not contact the first fluid 4, is contacting the second fluid 4'. The cap 201, at least in its central part, and the second fluid 4' should be transparent to the incident optical radiation which either will be reflected onto the membrane 2, or pass through it depending on the nature of the optical device.

The cap 201 can be made of glass or an organic material such as polyterephthalate ethylene PET, polynaphthalate ethylene, polymethylmethacrylate PMMA, polycarbonate PC should it transmit wavelengths in the visible. The cap 201 provides protection of the membrane 2 because such optical devices with a deformable membrane 2 are fragile objects the handling of which is delicate.

Figure 6A:
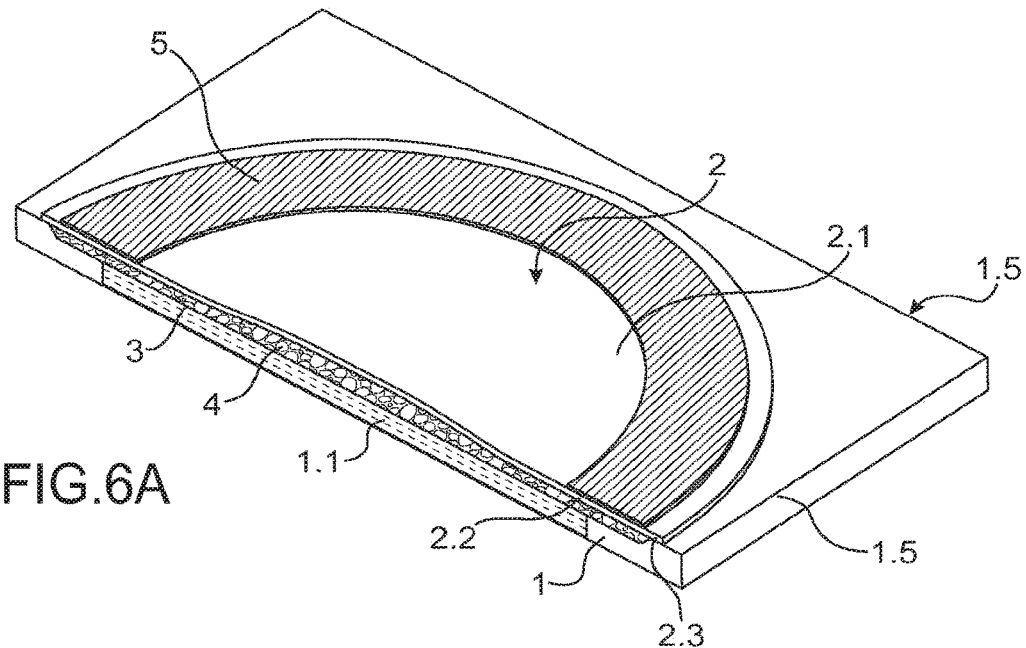
FIGS. 6A to 6E show different configurations of the support on which is anchored the membrane of an optical device according to the invention.

The support 1 can be monolithic as represented from the beginning of this description. In one alternative illustrated in FIG. 6A, it can be formed by a frame 1.5 integral with a plate 1.1 to form the dish 3. The plate 1.1 makes up the bottom of the dish 3, it is transparent to an optical radiation which will go through it or can be reflective in the case of a mirror. There is no change at the membrane 2, the actuating means, the fluid 4 with respect to the above described.

The transparent plate 1.1 can be of a substantially constant thickness, with planar substantially parallel faces, as in FIG.

6A. At least one face could be structured as in FIGS. 6B, 6C, 6D, where the external face is convex or concave. The choice is made depending on optical performances wanted for the optical device. It lets an optical radiation pass which will go through the lens. The frame 1.5 can be of a semi-conducting material such as silicon, which makes it integratable to circuits associated with processing of the order of the actuating means 5. Circuits are not represented so as not to overload figures. The transparent plate 1.1 can be of glass or plastics.

Figure 6B:
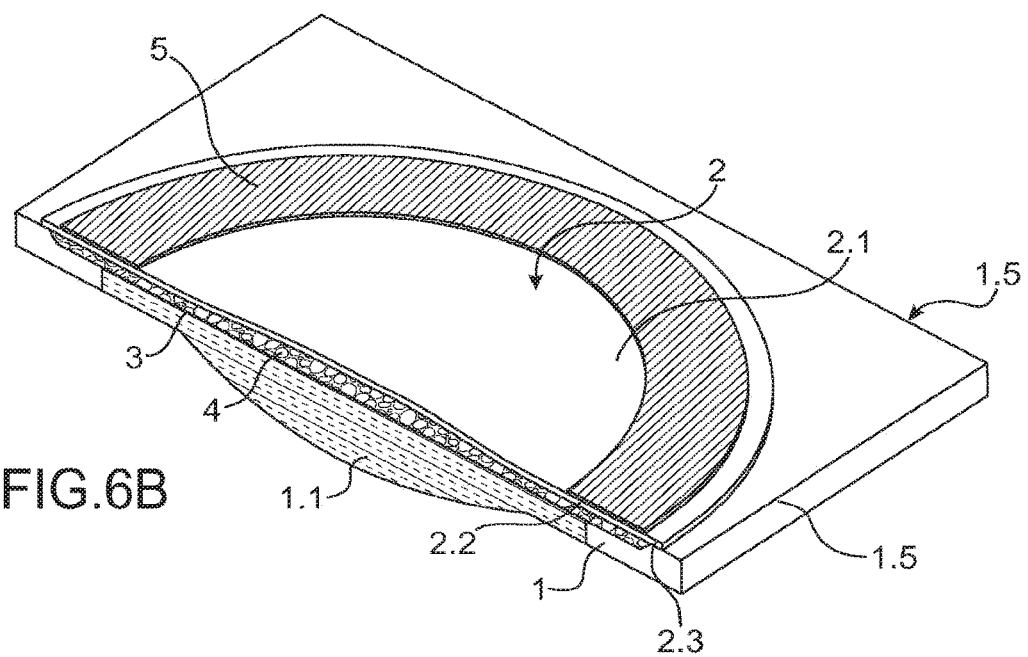
Figure 6C:
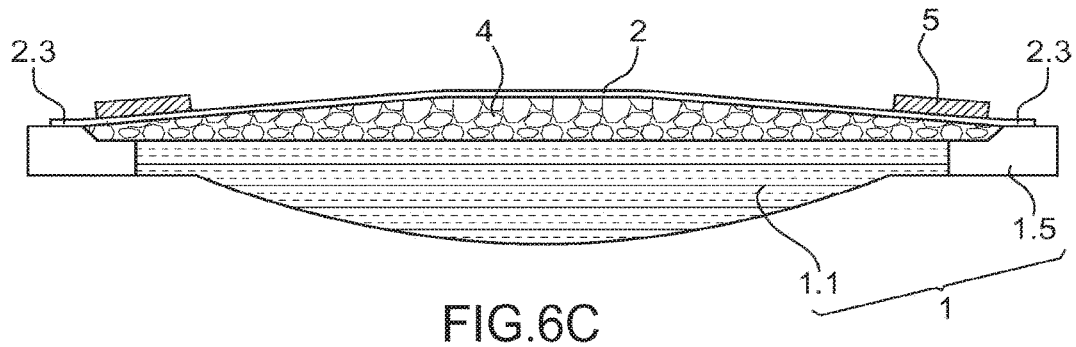
Figure 6D:
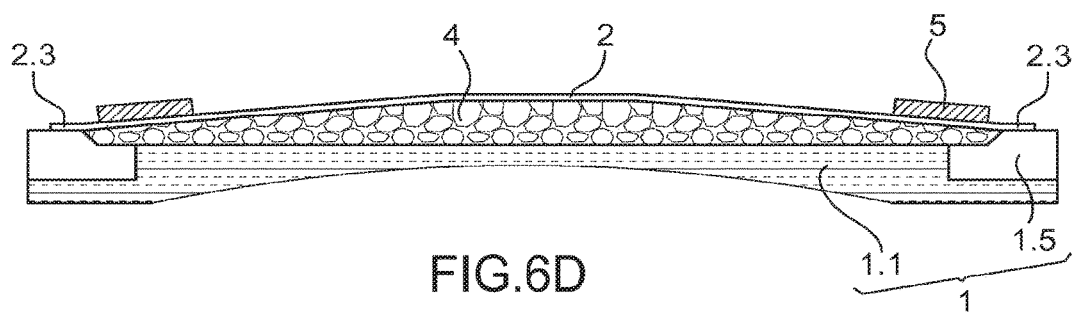

In FIGS. 6B, 6C, the transparent plate 1.1 is of convex structure and in FIG. 6D, it is of a concave structure. The structuration of the transparent plate 1.1 can be achieved through machining or moulding for example.

Figure 6E:
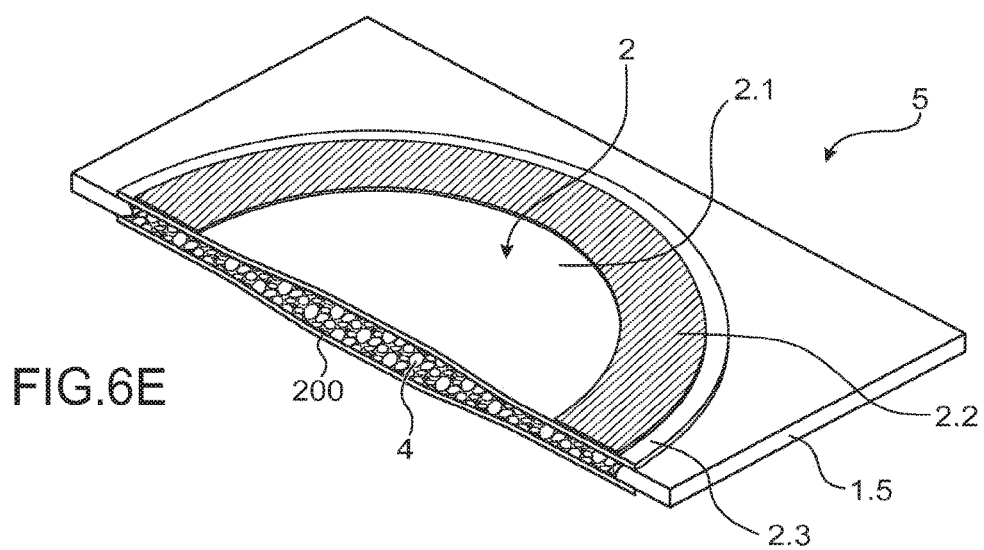

In FIG. 6E, the support 1 is indicated by the frame 1.5 and the transparent plate 1.1 is replaced by a second membrane 200. The second membrane 200 includes a layer which has substantially the same area as the first membrane 2. Both membranes 2, 200 are anchored to the frame 1.5, each on one of its main faces. They help in creating a housing for the liquid 4. This enables the optical performances of the membrane 2 to be increased. The actuating means 5 are provided on a single one of the membranes 2. The other membrane 20 is not actuated, but it is deformed all the same when the actuating means 5 are actuated.

Alternatively, second actuating means may be provided for actuating the other membrane 200.

The optical device can be made by techniques known in microelectronics. Various techniques can be used, such as thin layer depositing techniques of the chemical vapour deposition type, physical electrodeposition vapour deposition type, epitaxy, thermal oxidation, evaporation, film rolling. The organic or sol-gel type materials can be deposited through spin coating. Moulding, embossing, heat embossing, nanoimprinting techniques can be employed to structure the bottom face of the substrate as illustrated in FIGS. 6B to 6D. Bonding techniques can also be used for bonding the membrane 2 to the support 1 or a bottom 3 to the frame 1.5 or the cap 201 to the support 1, these techniques can for example be selected from direct bonding, eutectic bonding, anodic bonding and organic bonding. Thinning steps for example lapping, chemical thinning or a combination of both types can be provided after bonding the bottom to the frame. The optical device can be manufactured batchwise and all the caps 201 of different devices can be collectively made.

The membrane 2 can be made based on organic materials such as polydimethylsiloxane, polymethylmethacrylate, polyterephthalate ethylene, polycarbonate, parylene, epoxy resins, photosensitive polymers, silicones, such as those known as SiNR from Shin-Etsu or as WL5150 from Dow Corning or mineral materials, such as silicon, silicon oxide, silicon nitride, silicon carbide, polycrystalline silicon, titanium nitride, diamond carbon, tin indium oxide, aluminium, copper and nickel. Natural or synthetic rubber can also be used at least for the layer which lies in the central area because they allow high elastic deformations. The strengthening layer could be made of a piezoelectric material selected from those mentioned for the continuous crown. The piezoelectric bimorph would then be homogeneous. The membrane has a thickness ranging from one micron to one millimeter. The thickness selected depends on the material used and the deposition process used. The strengthening layer will have a thickness between about ten nanometers and a few micrometers.

Each of the fluids 4, 4' can be a liquid as propylene carbonate, water, a refractive index liquid, an optical oil or even a ionic liquid, or any liquid enabling a refractive step index to be achieved with respect to the fluid 4 present on the other side of the membrane 2. As a gas, air, nitrogen and helium can be mentioned for example.

The piezoelectric material of the actuating means 5 can be selected from PZT that is Lead Titano-Zirconate with the formula $Pb(Zr_x, Ti_{1-x})O_3$, aluminium nitride AlN, polyvinylidene floride (PVDF) and its trifluoroethylene copolymers (TrFE), zinc oxide ZnO, barium titanate $BaTiO_3$, lead niobate $PNbO_3$, bismuth titanate $Bi_4Ti_3O_{12}$ or other sillenites which are oxides with a metal/oxygen ratio equal to 2/3. It is attempted to have the piezoelectric material with a highest mechanical coupling factor possible. A thickness of the crown of piezoelectric material ranges from a few hundred nanometers to a few micrometers. The thickness is to be adapted to the bias voltage range to be applied, to the breakdown field associated to the piezoelectric material and to the desired optical performances.

The electrodes of the actuating means can be of platinum, or a platinum-titanium bilayer if it is to be deposited on an oxide, the titanium acting as a glue between platinum and oxide. Gold or a chromium-gold layer can also be used, the chromium acting as a barrier against diffusion of gold. Another suitable material is ruthenium. This list is not exhaustive. The characteristic thicknesses for electrodes range from a few tens of nanometers to about one micron.

The deposition of a layer of piezoelectric material such as PZT requires annealings at high temperature in the order of 800° C. Quite often, the material of the membrane does not withstand these temperatures. Therefore, the actuating means of piezoelectric material must be made first and then assembled to the membrane. During the manufacture of the optical device according to the invention, some constraints must be taken into account when making the stack.

The inventors have realised that since the different materials making up the optical device, object of the invention, did not have the same thermal expansion coefficient, the focal length of the optical device could be caused to change unintentionally.

Figure 7A:
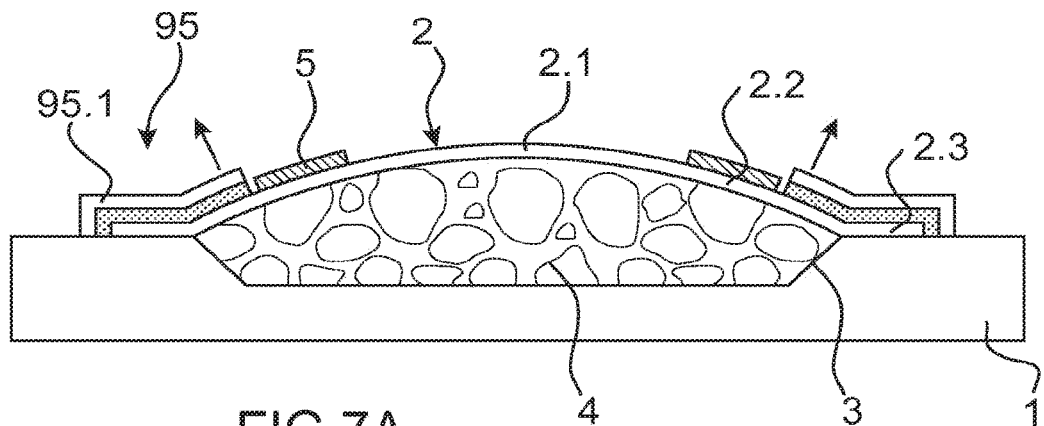
FIGS. 7A, 7B show an optical device according to the invention equipped with means for compensating a variation in its focal length due to a variation in temperature.
Figure 7B:
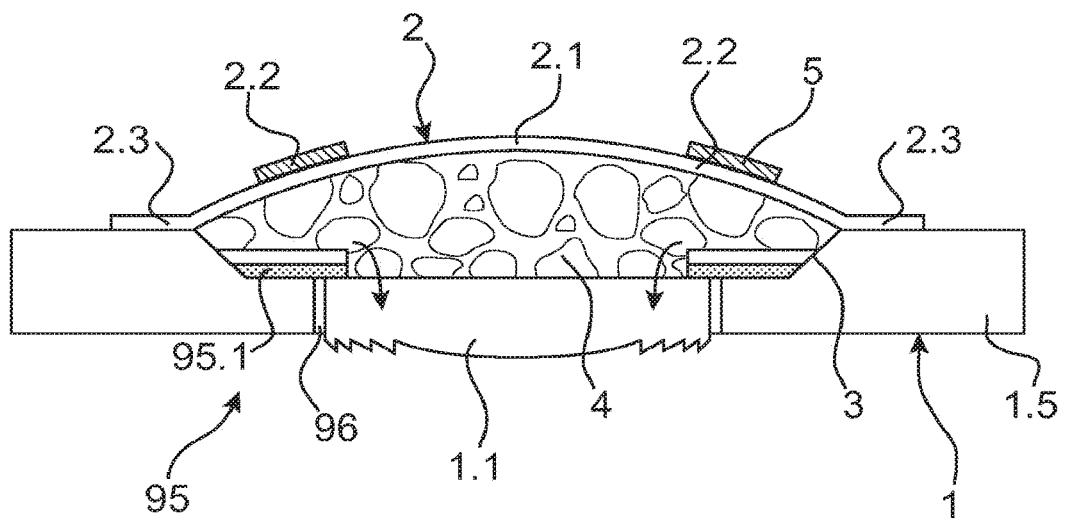

It is therefore possible to provide means for compensating a variation in the focal length due to a variation in temperature. FIGS. 7A, 7B can be referred to.

This compensating means 95 are formed by one or more thermal bimorph elements 95.1 arranged as a continuous crown anchored to the membrane 2 at the anchor area 2.3 by projecting onto the intermediate area 2.2 as in FIG. 7A, that is at the bottom 3.1 of the dish 3 as in FIG. 7B. These thermal bimorph elements 95.1 are dedicated to this compensation. Under the effect of a temperature increase causing in particular a volume increase of the fluid 4 entrapped between the membrane 2 and the support 1, and thus an undesired deformation of the membrane 2, the thermal bimorph elements 95.1 deform to increase the volume of the dish 3 by increasing its thickness. A thermal bimorph element 95.1 formed by two superimposed layers made of materials having different thermal expansion coefficients does not raise a problem for those skilled in the art.

In the configuration of FIG. 7B, the support 1 is similar to that of FIG. 6B. The thermal bimorph elements 95.1 are located, on the fluid 4 side, on the frame 1.5 and project onto the transparent plate 1.1. The transparent plate 1.1 is concave in its central part and includes thin grooves at its periphery. An expansion joint 96 is inserted between the plate 1.1 and the frame 1.5 to provide suppleness along the optical axis and enable the volume of the dish 3 to be increased. The volume increase of the dish 3 will come from the deformation of the membrane 2 at the edge of the anchor area 2.3 and/or the support 1. The purpose is that an expansion of the fluid 4 entrapped between the membrane 2 and the support 1 does not have influence on the deflection of the membrane 2 in the central area 2.1 and therefore on the focal length of the optical device.

The means 95 for compensating a variation in the focal length under the effect of a variation in temperature could also help the membrane to be subjected to a substantially constant residual stress, regardless of the weather conditions. Thus, a buckling or crumping of the membrane 2 is avoided in the case of an excessive compressive stress or on the contrary an excessive tension resulting in degrading the performances of the optical device.

The choice of the material(s) of the membrane 2 is made to meet requirements of the manufacturing process or for the liquid lens or mirror to achieve some performances.

The optical device is all the more efficient for a given energy consumption that its central area 2.1 is supple. A silicone organic material is particularly suitable. It is then preferable to rigidify the membrane 2 at the intermediate area 2.2 by providing the strengthening layer 2c, for example of a mineral material such as silicon oxide and/or silicon nitride on the organic layer which extends from the central area 2.1 to the anchor area 2.3. A membrane 2 the central area 2.1 of which is of silicon oxide or nitride oxide would also be suitable.

Also, the actuating means 5 are so arranged that, once fastened onto the membrane 2, they do not disturb the expected behaviour of the membrane 2. The deformation of the membrane 2 at rest should be compatible with the wanted use of the optical device. The membrane 2 can, at rest, form a substantially planar, concave or convex dioptre.

It is also attempted to subject, the membrane 2 at rest to a residual compressive stress low enough to generate neither crumping nor buckling. In the same way, at rest, the membrane 2 must be subjected to a tensile stress low enough to efficiently react to actuation of actuating means 5, which would not be the case if it were excessively tensioned. A trade-off is therefore to be found between tensile and compressive stresses.

The strengthening layer 2c must be sufficiently rigid to pass on to the fluid 4, entrapped between the membrane 2 and the support 1, the pressure applied by the actuating means 5 and thus generate wanted movements of the fluid 4. Some materials usable for the strengthening layer are listed below. It can be metal materials such as titanium, titanium nitride, aluminium the thickness of which will be in the order of about ten nanometers to a few micrometers and the Young modulus of which is between a few tens GPa to a few hundreds GPa. It can be materials such as silicon oxide, silicon nitride the thickness of which will be in the order of about ten nanometers to a few micrometers and the Young modulus of which is between a few tens GPa to a few hundreds GPa. Finally, it can be organic materials such as photosensitive polymers and in particular benzocyclobutenes (BCB) the thickness of which will be in the order of a few micrometers and the Young modulus of which is a few GPa.

One exemplary manufacturing process of the optical device with a variable focus according to the invention will now be described. A sacrificial layer will be used. FIGS. 8A to 8G are referred to.

Figure 8A:
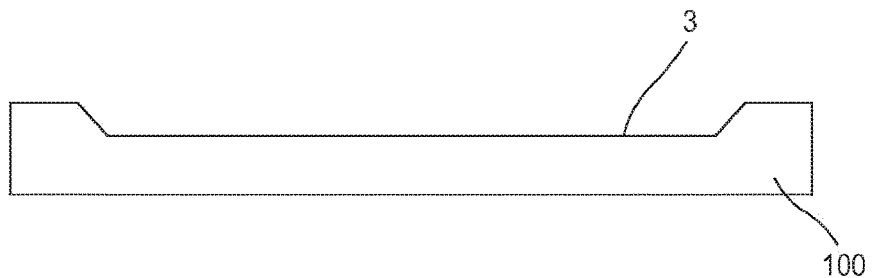
FIGS. 8A to 8G show different manufacturing steps of an optical device according to the invention.
Figure 8B:
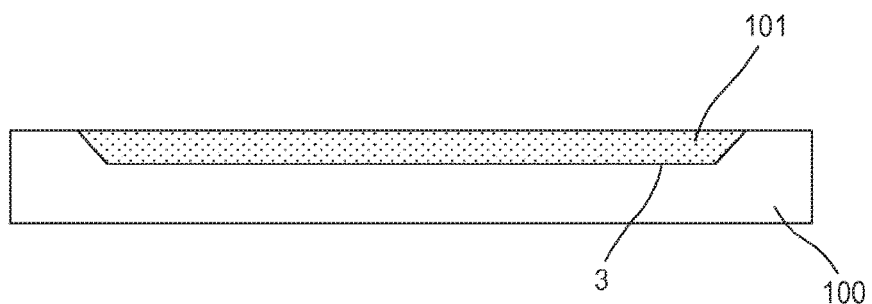

The starting point is substrate 100 wherein a dish 3 has been etched. The substrate 100 can be made for example of glass (FIG. 8A). It forms the support 1. A sacrificial material 101 is deposited into the dish 3 (FIG. 8B). The sacrificial material 101 can be organic, for example a photosensitive resin, or a mineral material such as silicon oxide.

Figure 8C:
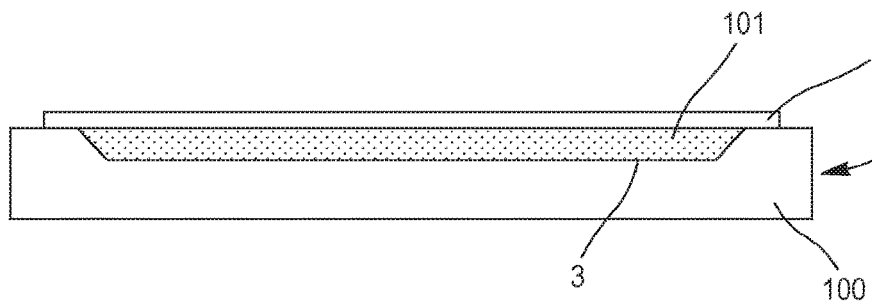

The membrane 2 is formed onto the sacrificial material 101, so that it projects onto the edge of the dish 3 and anchors thereto (FIG. 8C). A material selected from the materials listed above for the membrane 2 can be deposited. The deposition can be made by spin coating or chemical vapour deposition.

Figure 8D:
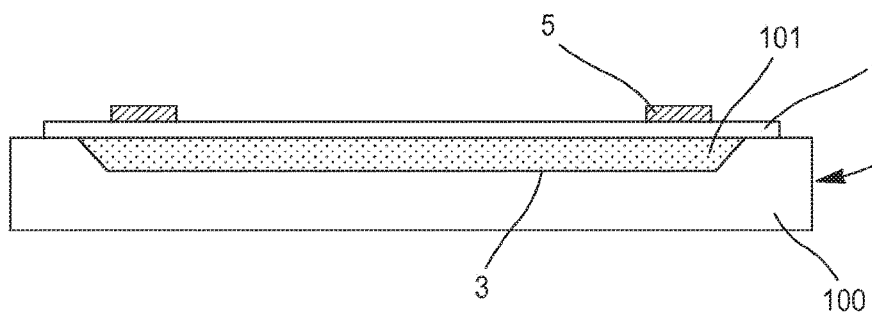
Figure 8E:
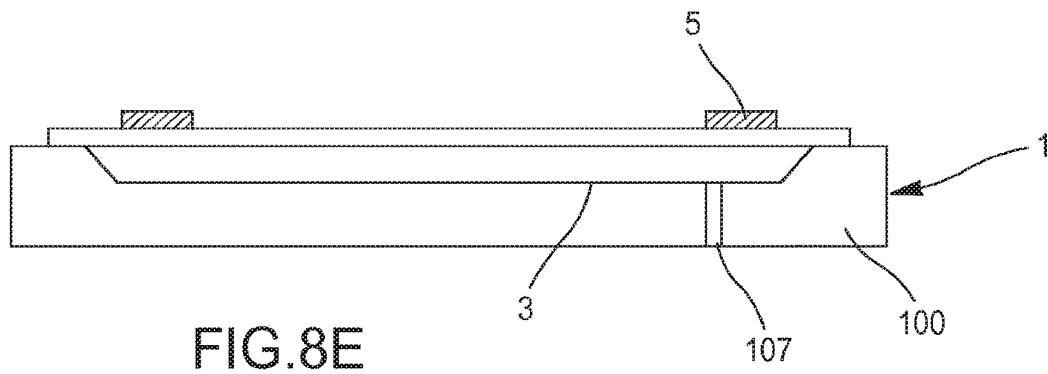
Figure 8F:
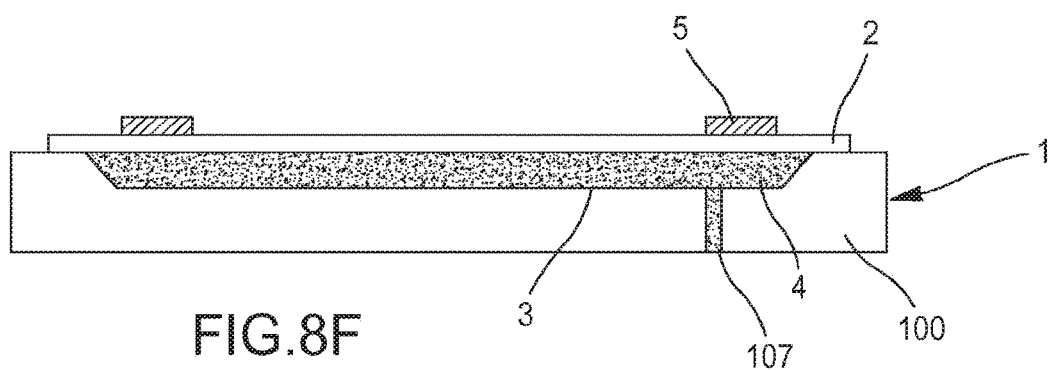
Figure 8G:
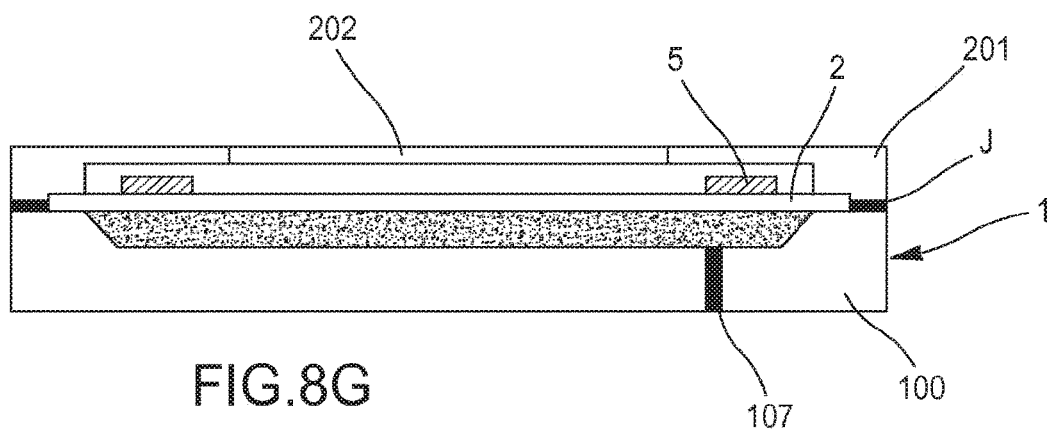

Then, the actuating means 5 are formed at the intermediate area 2.2 contacting or not the support 1. First, one or more electrodes underlying the piezoelectric material to come are made, and then the circular continuous crown of piezoelectric material is deposited followed by the overlying electrode(s), bearing in mind that finally, several pairs of electrodes are required. Neither the crown nor the electrodes are referenced so as not to overload the figures. The techniques employed are the conventional ones used in microsystems such as thin layer deposition, lithography and etching (FIG. 8D). Then, the membrane 2 is released by removing the sacrificial material. For this, at least one hole 107 can be drilled, outside the optical field (central area 2.1), in the substrate 100 to reach the sacrificial material 101. The hole 107 is a through hole and opens into the dish 3 (FIG. 8E). The removal can be chemical or thermal or through oxygen plasma. The dish 3 is then filled with the fluid 4 (FIG. 8F). The filling can be made by depressurizing the dish 3 to promote the penetration of the fluid 4 and avoid bubbling if it is a liquid. Finally, the hole 107 is plugged to prevent the fluid 4 from leaking (FIG. 8F). An organic material can be used. The order of the steps is not limiting.

The actuating means 5 could also be formed after releasing the membrane 2 for example, before or after filling. They can also be formed onto the sacrificial layer 101 before forming the membrane 2, if they have to be finally located on the side of the fluid 4 entrapped between the support 1 and the membrane 2. In such a configuration, the membrane 2 is overlying the actuating means 5.

If it is desired that the membrane 2 at rest is bulged, concave or convex, a suitable curvature is imparted to the free face of the sacrificial layer 101, because it is used as a mould to the membrane 2. Another solution to obtain a bulged membrane 2 would be to buckle it after the release thereof. The buckling can be thermal. The determined parameters thus are the difference in thermal expansion coefficients between the membrane 2 and the substrate and the deposition temperature of the membrane 2.

To protect the membrane 2, that the optical device of the invention can be made by assembling a support 1 and a cap 201 as described in FIG. 5L. It is not mandatory that the cap 201 is solid, in FIG. 8G, it is recessed in its central part, the opening has the reference 202. A glue joint J is used to assemble the support 1 and the cap 201.

Figure 9A:
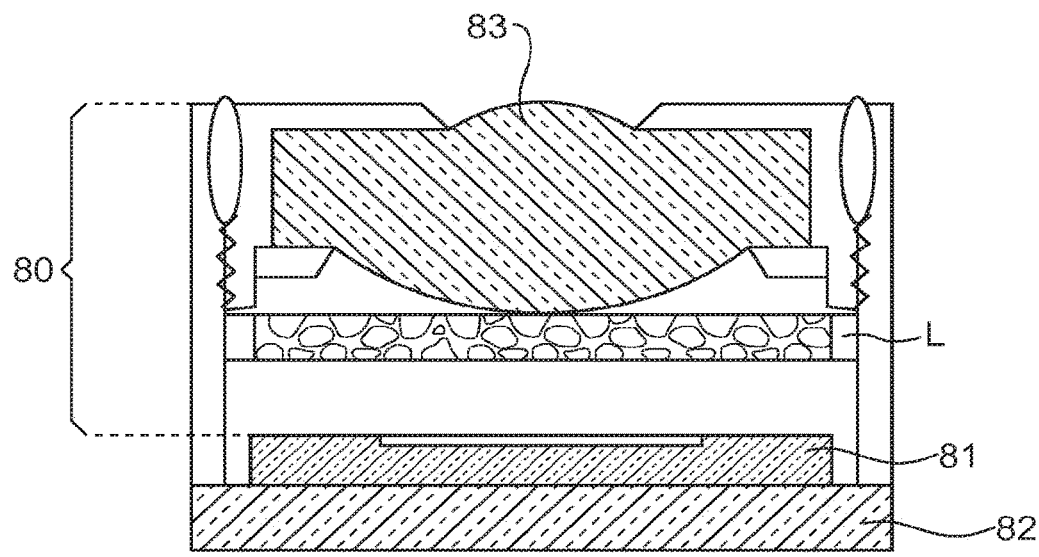
FIGS. 9A, 9B show an optical device according to the invention mounted in a camera.

Such an optical device with a variable focal length can be used in a camera device such as a camera of a portable phone. FIG. 9A is referred to. Such a camera device includes in cascades an objective lens 80 including at least one optical device with a variable focal length L according to the invention of the liquid lens type, an image sensor 81 for example of the CCD or CMOS type carried by a substrate 82. In the example described, the objective lens 80 includes at least one lens 83 with a fixed focal length and a liquid lens L according to the invention. In the following, this lens 83 with a fixed focal length will be called conventional optical block. The liquid lens L lies adjoining the conventional optical block 83 on the image sensor 81 side. Alternatively, the conventional optical block 83 can lie between the liquid lens L and the image sensor 81. The conventional optical block 83 is static. As seen previously, as for its manufacturing process, the liquid lens L can be assimilated to a MOEMS (microoptoelectromechanical system). The liquid lens L with a variable focus is placed at some distance, which depends on characteristics of the objective lens 80, on the image sensor 81, but if this distance is small, the liquid lens L and the image sensor 81 could make only one component if they are integrated either in AIC (above integrated circuit) technology, or in WLCSP (Wafer Level Chip Scale Package) technology. The focal length of the liquid lens L is adapted by optimizing the pressure of the liquid at rest, but also the curvature of the membrane 2 at rest and the reflective index of the liquid.

Figure 9B:
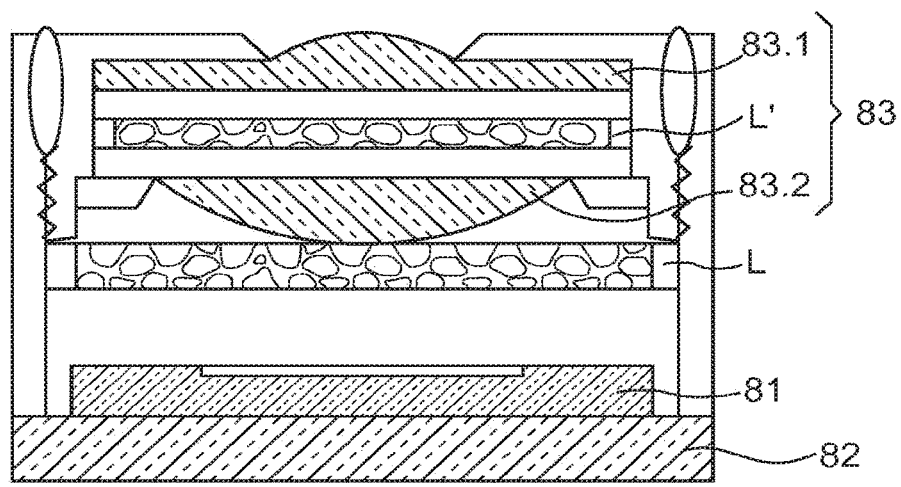

If the camera device also includes the zoom function as in FIG. 15B, an optical block 83 will be used with at least two lenses 83.1, 83.2 with a fixed focal length and two liquid lenses L and L' one of which lies between both lenses 83.1, 83.2 of the optical block 83 and the other adjoining the optical block 83 on the image sensor 81 side as in FIG. 9B. In these FIGS. 9A, 9B, the optical devices according to the invention referenced L and L' are very schematically represented, and their actuating means 5 cannot be seen.

With an optical device according to the invention having a given bulk, the area of the actuating means 5 can be maximized by using a single continuous crown of piezoelectric material which accommodates one or more piezoelectric actuators. The energy provided by the actuating means can be maximized which enables either the movement of the fluid to be improved and thus the performances of the optical device with a constant power voltage to be improved, or the power voltage to be minimized at equivalent optical performances.

By anchoring the actuating means to the membrane in the intermediate area, the bulk of the device can be reduced with respect to configurations wherein the actuating means are anchored to the support.

Providing means for compensating a variation in the focal length due to a variation in temperature enables the focal length of the device to be maintained constant regardless of the temperature taken in a given range.

Simulations have been performed to compare an optical device according to the invention to an optical device wherein the actuating means include several piezoelectric actuators as radial beams as in French patent application FR 2919073. These simulations have been performed by biasing the structure without the presence of a liquid.

Figure 10A:
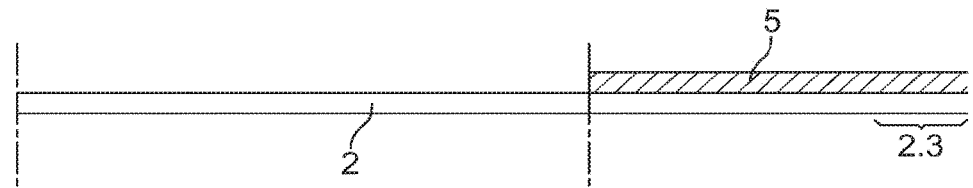
FIGS. 10A, 10B, 10C enable the efficiency between an optical device according to the invention and an optical device such as that described in patent application FR 2919073 to be compared.

FIG. 10A shows an axisymmetric two-dimension pattern of the membrane equipped with the actuating means 5 as a continuous crown. The membrane formed by a parylene homogeneous layer has a radius of millimeters and a thickness of 1 micrometer. The continuous crown has a width of 500 micrometers and a thickness of one micrometer. It is made of PZT. The continuous crown is anchored to the support in the anchor area.

Figure 10B:
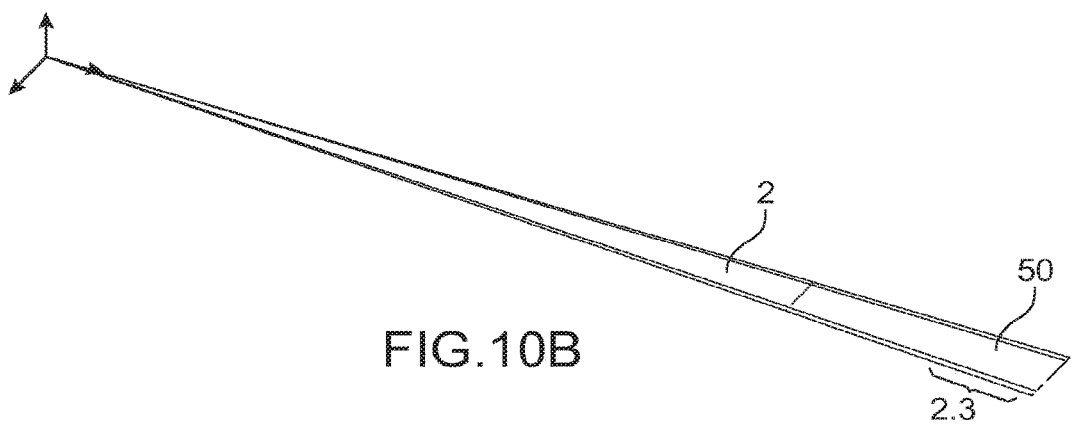
Figure 10C:
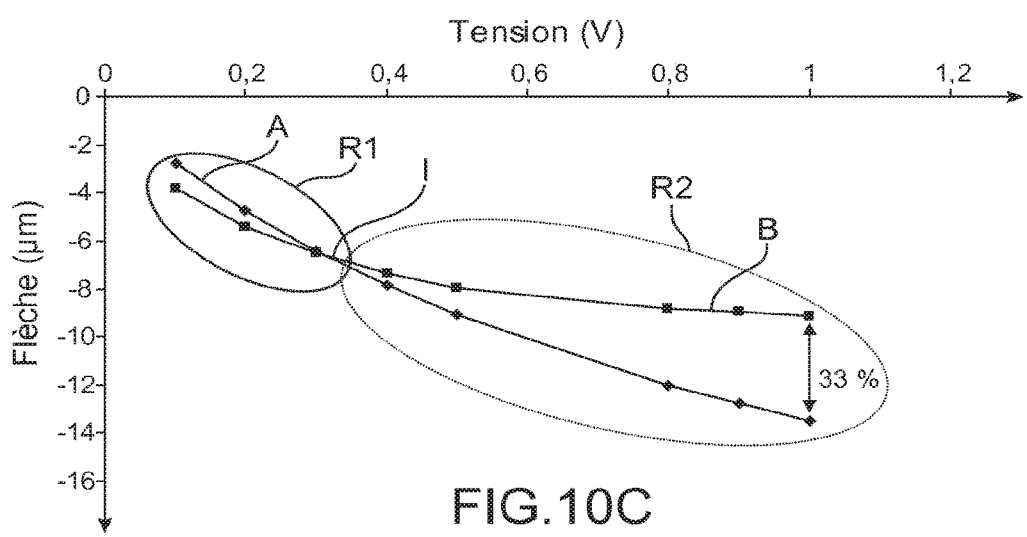

FIG. 10B is a cyclic three-dimension pattern of the membrane equipped with a beam 50 in the micrometric scale. The membrane formed by a parylene homogeneous layer has a radius of 2 millimeters and a thickness of 1 micrometer. The beam has a length of 500 micrometers, a width of 100 micrometers and a thickness of one micrometer. It is made of PZT. The beam is anchored to the support in the anchor area.

The graph of FIG. 10C shows the variation in the deflection in the membrane in the central area as a function of the bias voltage applied to the actuating means. The curve referenced A corresponds to the continuous crown and the curve referenced B corresponds to the beam. Two interesting regimens R1, R2 can be distinguished. Both curves A, B are intersecting, the point of intersection is noted I. In the first regimen R1 which corresponds to bias voltages lower than about 0.32V, at the left of the point of intersection I, the beam gives the best deflections. The continuous ring undergoes a rigidity effect which causes an energy efficiency loss. The difference between deflections is even in the order of 25% for the lowest bias voltage (0.1V). In the second regimen R2, for voltages higher than 0.32V, at the right of the point of intersection I, the continuous crown gives the best results. It benefits from a surface effect which results in a better energy efficiency. The difference between deflections is even in the order of 33% for the highest bias voltage (1V).

Even though several embodiments of the present invention have been described in detail, it will be understood that different changes and alterations can be provided without departing from the scope of the invention and in particular many other processes can be used to make the membrane and the actuating means.

The invention claimed is:

1. An optical device, comprising:
 a deformable membrane, including:
  an anchor area to anchor the deformable membrane on a support, wherein fluid is entrapped within a cavity at least partially defined by the deformable membrane and the support;
  a central area that is reversibly deformable from a rest position; and
  an intermediate area between the anchor area and the central area; and
 an actuator unit to bias at least the intermediate area to move the fluid such that the fluid deforms the central area with respect to its rest position, the actuator unit including:
  a continuous crown of piezoelectric material that is mounted about the central area without overlapping the central area; and
  electrodes that sandwich the continuous crown;
  wherein the actuator unit is integrated at least partially in the deformable membrane.

2. The optical device of claim 1, wherein the actuator unit and the deformable membrane form at least one piezoelectric bimorph.

3. The optical device of claim 2, wherein:
 the deformable membrane includes a stack of layers at least at the intermediate area; and
 the stack of layers includes:
  a first layer; and
  a second layer that is more rigid than the first layer, wherein the second layer is part of the piezoelectric bimorph.

4. The optical device of claim 1, wherein the actuator unit is anchored to at least the intermediate area of the deformable membrane.

5. The optical device of claim 1, wherein:
 the continuous crown accommodates one or more piezoelectric actuators that are each formed at least in part by a respective pair of the electrodes that sandwich the continuous crown.

6. The optical device of claim 5, wherein the one or more piezoelectric actuators include:
 a first piezoelectric actuator that is formed at least in part by a first electrode and a second electrode; and
 a second piezoelectric actuator that is formed at least in part by the first electrode and one of the second electrode or a third electrode.

7. The optical device of claim 1, wherein:
the actuator unit is configured to radially contract, radially extend, or both, to bias at least the intermediate area to move the fluid in one or more directions such that the fluid deforms the central area with respect to its rest position; and
the one or more directions include at least one of:
   a first direction from the intermediate area to the central area; or
   a second direction from the central area to the intermediate area.

8. The optical device of claim 1, further comprising:
an auxiliary actuator unit anchored to the deformable membrane, wherein:
   the auxiliary actuator unit includes a discontinuous crown of piezoelectric material that accommodates one or more piezoelectric actuators;
   the discontinuous crown is concentrically mounted with the continuous crown; and
   the auxiliary actuator unit and the deformable membrane form at least one piezoelectric bimorph.

9. The optical device of claim 1, wherein at least the central area of the deformable membrane is a lens or a mirror.

10. A camera module, comprising:
a deformable membrane, including:
   an anchor area to anchor the deformable membrane on a support, wherein fluid is entrapped within a cavity at least partially defined by the deformable membrane and the support;
   a central area that is reversibly deformable from a rest position; and
   an intermediate area between the anchor area and the central area;
an actuator unit to bias at least the intermediate area to move the fluid such that the fluid deforms the central area with respect to its rest position, the actuator unit including:
   a continuous crown of piezoelectric material that is mounted about the central area without overlapping the central area; and
   electrodes that sandwich the continuous crown;
   wherein the actuator unit is integrated at least partially in the deformable membrane; and
an image sensor to capture light that has passed through the deformable membrane.

11. The camera module of claim 10, wherein:
the actuator unit and the deformable membrane form at least one piezoelectric bimorph;
the deformable membrane includes a stack of layers at least at the intermediate area; and
the stack of layers includes:
   a first layer; and
   a second layer that is more rigid than the first layer, wherein the second layer is part of the piezoelectric bimorph.

12. The camera module of claim 10, wherein the actuator unit is anchored to at least the intermediate area of the deformable membrane.

13. The camera module of claim 10, wherein:
the continuous crown accommodates one or more piezoelectric actuators that are each formed at least in part by a respective pair of the electrodes that sandwich the continuous crown.

14. The camera module of claim 10, wherein:
the actuator unit is configured to radially contract, radially extend, or both, to bias at least the intermediate area to move the fluid.

15. The camera module of claim 10, further comprising:
an auxiliary actuator unit anchored to the deformable membrane, wherein:
   the auxiliary actuator unit includes a discontinuous crown of piezoelectric material that accommodates one or more piezoelectric actuators; and
   the discontinuous crown is concentrically mounted with the continuous crown.

16. The camera module of claim 10, wherein:
the deformable membrane and the actuator unit are part of a first optical device with a first variable focus lens; and
the camera module further includes at least one of:
   a fixed lens; or
   a second variable focus lens.

17. An actuator unit of an optical device, the actuator comprising:
a continuous crown of piezoelectric material that is mounted about a central area of a deformable membrane of the optical device without overlapping the central area, wherein:
   the central area is reversibly deformable from a rest position;
   an anchor area of the deformable membrane is anchored on a support of the optical device; and
   fluid is entrapped within a cavity at least partially defined by the deformable membrane and the support; and
electrodes that sandwich the continuous crown;
wherein:
   the actuator is integrated at least partially in the deformable membrane; and
   the actuator biases at least an intermediate area of the deformable membrane, that is between the anchor area and the central area, to move the fluid such that the fluid deforms the central area with respect to its rest position.

18. The actuator unit of claim 17, wherein:
the actuator unit and the deformable membrane form at least one piezoelectric bimorph;
the deformable membrane includes a stack of layers at least at the intermediate area; and
the stack of layers includes:
   a first layer; and
   a second layer that is more rigid than the first layer, wherein the second layer is part of the piezoelectric bimorph.

19. The actuator unit of claim 17, wherein:
the continuous crown accommodates one or more piezoelectric actuators that are each formed at least in part by a respective pair of the electrodes that sandwich the continuous crown.

20. The actuator unit of claim 17, wherein:
the actuator unit is configured to radially contract, radially extend, or both, to bias at least the intermediate area to move the fluid.

* * * * *